US010068913B2

(12) United States Patent
Son et al.

(10) Patent No.: US 10,068,913 B2
(45) Date of Patent: Sep. 4, 2018

(54) THREE DIMENSIONAL SEMICONDUCTOR DEVICES

(71) Applicants: Jaeick Son, Hwaseong-si (KR); Sunghoon Kim, Seongnam-si (KR)

(72) Inventors: Jaeick Son, Hwaseong-si (KR); Sunghoon Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/633,941

(22) Filed: Jun. 27, 2017

(65) Prior Publication Data
US 2018/0151587 A1 May 31, 2018

(30) Foreign Application Priority Data

Nov. 28, 2016 (KR) .................. 10-2016-0159577

(51) Int. Cl.
*H01L 29/06* (2006.01)
*H01L 47/00* (2006.01)
(Continued)

(52) U.S. Cl.
CPC .... *H01L 27/11573* (2013.01); *G11C 13/0038* (2013.01); *G11C 16/30* (2013.01); *H01L 23/5286* (2013.01); *H01L 27/1157* (2013.01); *H01L 27/11524* (2013.01); *H01L 27/11529* (2013.01); *H01L 27/11556* (2013.01);
(Continued)

(58) Field of Classification Search
CPC ......... H01L 27/11573; H01L 27/11582; H01L 23/5286; H01L 29/94; H01L 27/249; H01L 27/1157; H01L 27/11529; H01L 27/11556; H01L 27/11524; H01L 27/2454; G11C 13/0038; G11C 16/30
See application file for complete search history.

(56) References Cited

U.S. PATENT DOCUMENTS 7,078,775 B2  7/2006 Yi et al.
7,679,133 B2  3/2010 Son et al.
(Continued)

FOREIGN PATENT DOCUMENTS

JP  2003-086685 A  3/2003
JP  2009-500824 A  1/2009
(Continued)

*Primary Examiner* — Victor A Mandala
(74) *Attorney, Agent, or Firm* — Harness, Dickey & Pierce, P.L.C.

(57) ABSTRACT

A three-dimensional semiconductor device includes a semiconductor substrate including a cell array region and a peripheral circuit region, an electrode structure including electrodes vertically stacked on the cell array region, a MOS capacitor on the peripheral circuit region, an interlayer dielectric layer covering the electrode structure and the MOS capacitor, first and second power lines spaced apart from each other in a first direction and extending in a second direction on the interlayer dielectric layer, first lower plugs connected to the first power line and a first terminal of the MOS capacitor, and second lower plugs connected to the second power line to a second terminal of the MOS capacitor. The second power line is on one of the first lower plugs that is adjacent to some of the second lower plugs in one of the first and second directions.

20 Claims, 20 Drawing Sheets

(51) Int. Cl.
*H01L 27/11573* (2017.01)
*G11C 13/00* (2006.01)
*G11C 16/30* (2006.01)
*H01L 23/528* (2006.01)
*H01L 27/11524* (2017.01)
*H01L 27/11529* (2017.01)
*H01L 27/11556* (2017.01)
*H01L 27/1157* (2017.01)
*H01L 27/11582* (2017.01)
*H01L 27/24* (2006.01)
*H01L 29/94* (2006.01)

(52) U.S. Cl.
CPC ...... *H01L 27/11582* (2013.01); *H01L 27/249* (2013.01); *H01L 27/2454* (2013.01); *H01L 29/94* (2013.01)

(56) References Cited

U.S. PATENT DOCUMENTS

| | | | |
|---|---|---|---|
| 7,713,815 B2 | 5/2010 | Lehr et al. | |
| 7,750,387 B2 | 7/2010 | Park | |
| 8,093,643 B2 | 1/2012 | Baker et al. | |
| 8,278,695 B2 | 10/2012 | Kidoh et al. | |
| 8,343,845 B2 | 1/2013 | Kim et al. | |
| 8,553,466 B2 | 10/2013 | Han et al. | |
| 8,559,235 B2 | 10/2013 | Yoon et al. | |
| 8,629,032 B2 | 1/2014 | Huanq | |
| 8,643,076 B2 | 2/2014 | Seo et al. | |
| 8,654,587 B2 | 2/2014 | Yoon et al. | |
| 8,810,002 B2 | 8/2014 | Jou et al. | |
| 9,029,933 B2 | 5/2015 | Salome et al. | |
| 2001/0045670 A1* | 11/2001 | Nojiri | H01L 23/5222 257/786 |
| 2004/0150007 A1* | 8/2004 | Kumagae | H01L 22/32 257/203 |
| 2010/0320526 A1 | 12/2010 | Kidoh et al. | |
| 2011/0233648 A1 | 9/2011 | Seol et al. | |
| 2014/0061748 A1 | 3/2014 | Lee | |
| 2014/0063943 A1* | 3/2014 | Nagashima | G11C 16/30 365/185.08 |
| 2014/0346611 A1* | 11/2014 | Oh | H01L 27/11286 257/383 |
| 2015/0318296 A1 | 11/2015 | Kim et al. | |
| 2015/0349079 A1 | 12/2015 | Masuoka et al. | |
| 2017/0117223 A1* | 4/2017 | Azmat | H01L 21/28518 |
| 2017/0278863 A1* | 9/2017 | Cha | H01L 27/11582 |

FOREIGN PATENT DOCUMENTS

| | | |
|---|---|---|
| KR | 10-1998-084806 | 5/1997 |
| KR | 10-2012-0033521 A | 4/2012 |
| KR | 10-2015-0126216 A | 11/2015 |
| KR | 10-1589912 B1 | 2/2016 |

* cited by examiner

THREE DIMENSIONAL SEMICONDUCTOR DEVICES

CROSS-REFERENCE TO RELATED APPLICATIONS

This U.S. nonprovisional patent application claims priority under 35 U.S.C § 119 to Korean Patent Application No. 10-2016-0159577, filed on Nov. 28, 2016, the entire contents of which are hereby incorporated by reference.

BACKGROUND

The present disclosure relates to a three-dimensional semiconductor device, and more particularly, to a three-dimensional semiconductor device including a power capacitor structure.

Semiconductor devices are considered to be an important factor in electronic industry because of their small size, multi-function, and/or low fabrication cost. The semiconductor devices may include a memory device storing logic data, a logic device processing operations of logic data, and a hybrid device having both memory and logic elements.

The semiconductor devices with high integration are often used in the electronic industry. There has been increasingly demanded for semiconductor devices having high operating speeds and/or excellent reliability. However, patterns of the semiconductor devices are becoming finer due to the tendency of high integration of the semiconductor devices. Decreasing the line width has made it more challenging to achieve semiconductor devices having high operating speeds and/or excellent reliability.

SUMMARY

Some example embodiments of inventive concepts relate to a three-dimensional semiconductor device capable of securing power capacitance within a limited area.

According to some example embodiments of inventive concepts, a three-dimensional semiconductor device may include a semiconductor substrate including a cell array region and a peripheral circuit region, an electrode structure on the semiconductor substrate and including electrodes that are vertically stacked on the cell array region, a MOS capacitor on the peripheral circuit region, an interlayer dielectric layer covering the electrode structure and the MOS capacitor, a first power line and a second power on the interlayer dielectric layer and arranged so the first power line and the second power line are spaced apart from each other in a first direction and extend in a second direction intersecting the first direction, a plurality of first lower plugs penetrating the interlayer dielectric layer and connecting the first power line to a first terminal of the MOS capacitor, and a plurality of second lower plugs penetrating the interlayer dielectric layer and connecting the second power line to a second terminal of the MOS capacitor. The second power line may be on one of the first lower plugs that may be adjacent to some of the second lower plugs in one of the first and second directions.

According to some example embodiments of inventive concepts, a three-dimensional semiconductor device may include a MOS capacitor on a semiconductor substrate and including first and second terminals, an interlayer dielectric layer covering the MOS capacitor, first lower plugs penetrating the interlayer dielectric layer and coupled to the first terminal of the MOS capacitor, second lower plugs penetrating the interlayer dielectric layer and coupled to the second terminal of the MOS capacitor, a first power line and a second power line on the interlayer dielectric layer. The first power line and the second power line may be spaced apart from each other in a first direction and may extend in a second direction crossing the first direction. The first power line may be electrically connected to the first lower plugs. The second power line may be electrically connected to the second lower plugs. The second power line may be on one of the first lower plugs that may be adjacent to the second lower plugs in one of the first and second directions.

According to some example embodiments of inventive concepts, a three-dimensional semiconductor device may include a MOS capacitor on a semiconductor substrate and including first and second terminals, an interlayer dielectric layer covering the MOS capacitor, a first vertical capacitor including first and second lower plugs penetrating the interlayer dielectric layer and being adjacent to each other in a first direction, a second vertical capacitor including a third lower plug penetrating the interlayer dielectric layer and being adjacent to the second lower plug in the second direction, and first and second power lines on the interlayer dielectric layer and extending in parallel in the second direction. The first power line may be connected to a first terminal of the MOS capacitor through the first and third lower plugs. The second lower plug may be connected to a second terminal of the MOS capacitor through the second lower plug.

According to some example embodiments of inventive concepts, a three-dimensional semiconductor device may include a substrate including a cell array region and a peripheral circuit region, a gate structure on a portion of the peripheral circuit region next to an impurity region in the peripheral circuit region, an interlayer dielectric layer covering the gate structure, a plurality of power lines on the interlayer dielectric layer over the peripheral circuit region, and a plurality of lower plugs on the peripheral circuit region. The gate structure may include a gate electrode on a gate insulating layer. The plurality of power lines may include a first power line and a second power line that are spaced apart from each other. The plurality of lower plugs may extend vertically through the interlayer dielectric layer. The plurality of lower plugs may include at least one first lower plug on the gate structure and electrically connected to the first power line. The plurality of lower plugs may include at least one second lower plug electrically connected to the second power line and arranged between the second power line and the peripheral circuit region of the substrate.

DETAILED DESCRIPTION

Hereinafter, three-dimensional semiconductor devices according to some example embodiments of inventive concepts will be discussed in conjunction with the accompanying drawings.

Figure 1:
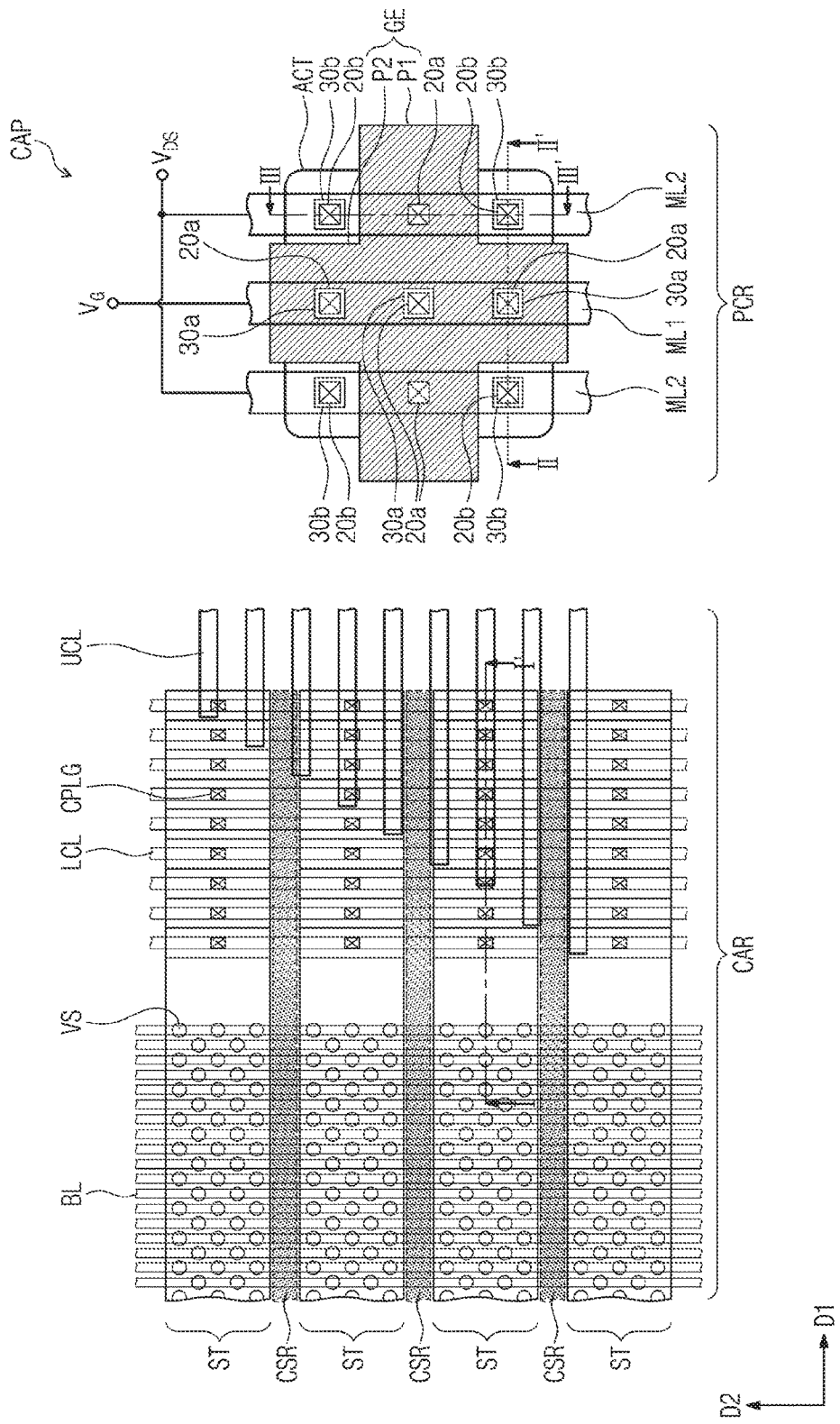
FIGS. 1 and 4 are plan views illustrating a semiconductor device according to some example embodiments of inventive concepts.
Figure 2:
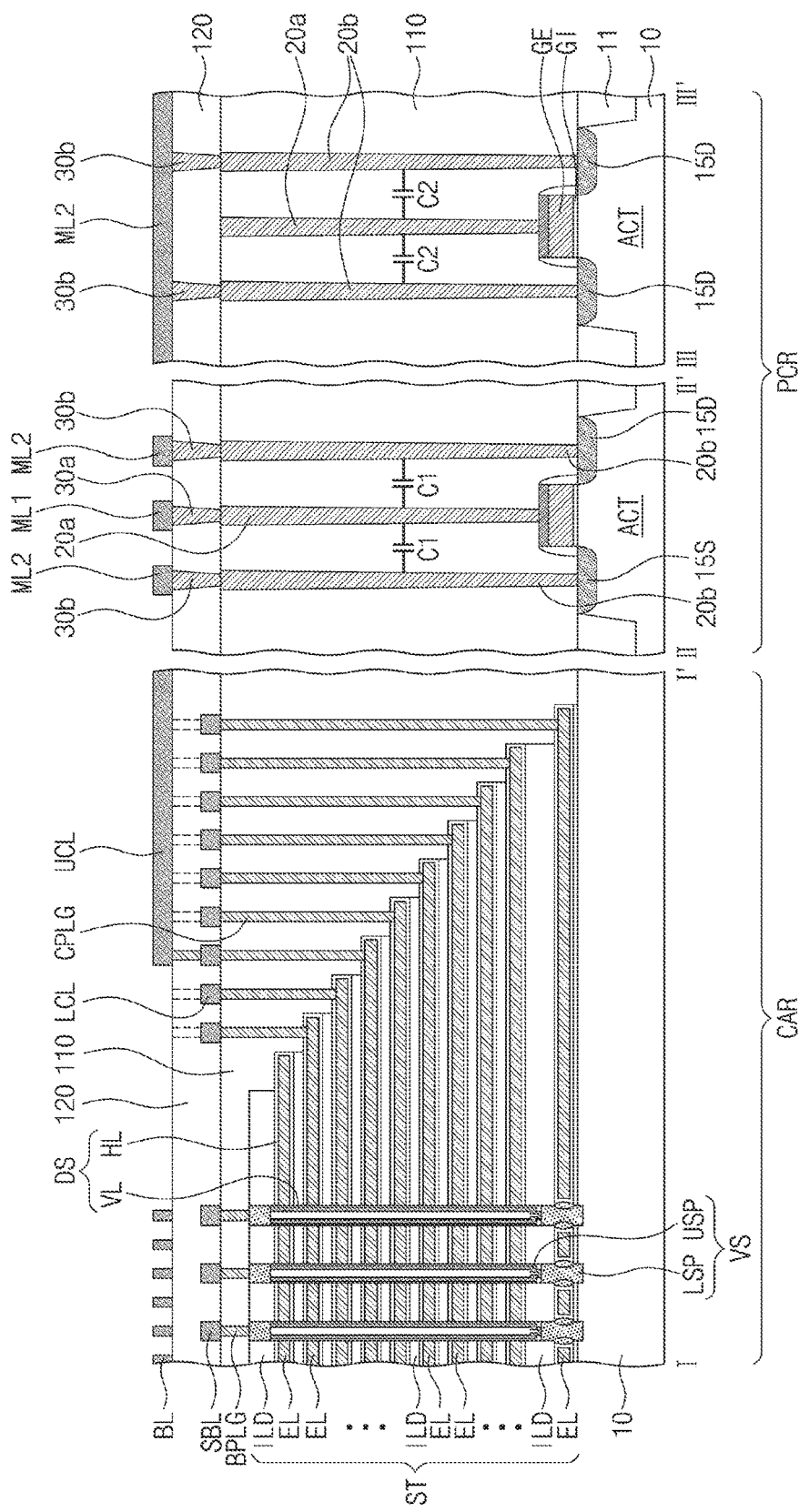
FIGS. 2 and 3 are cross-sectional views taken along lines I-I', II-II' and III-III' of FIG. 1.
Figure 3:
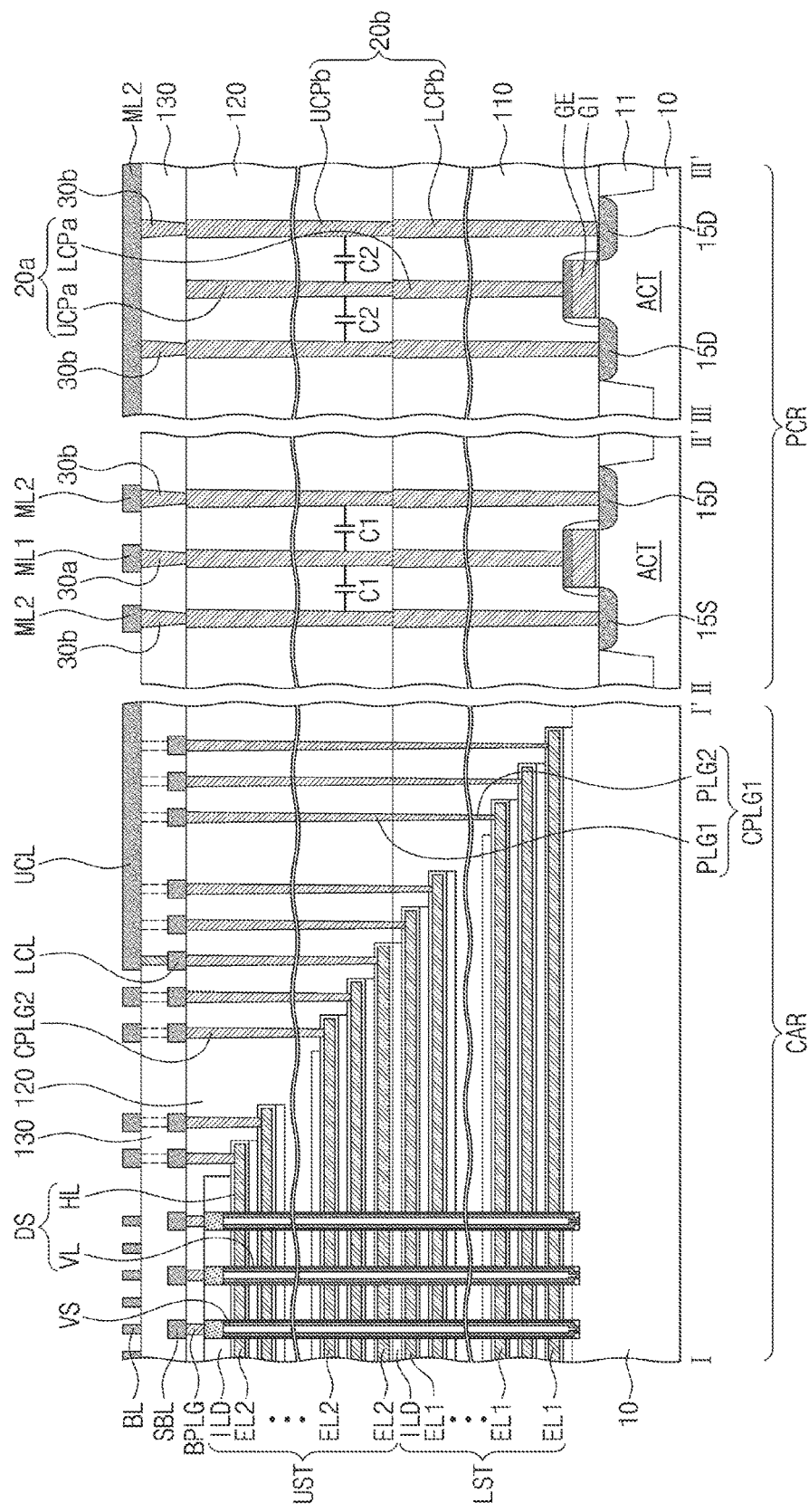
Figure 4:
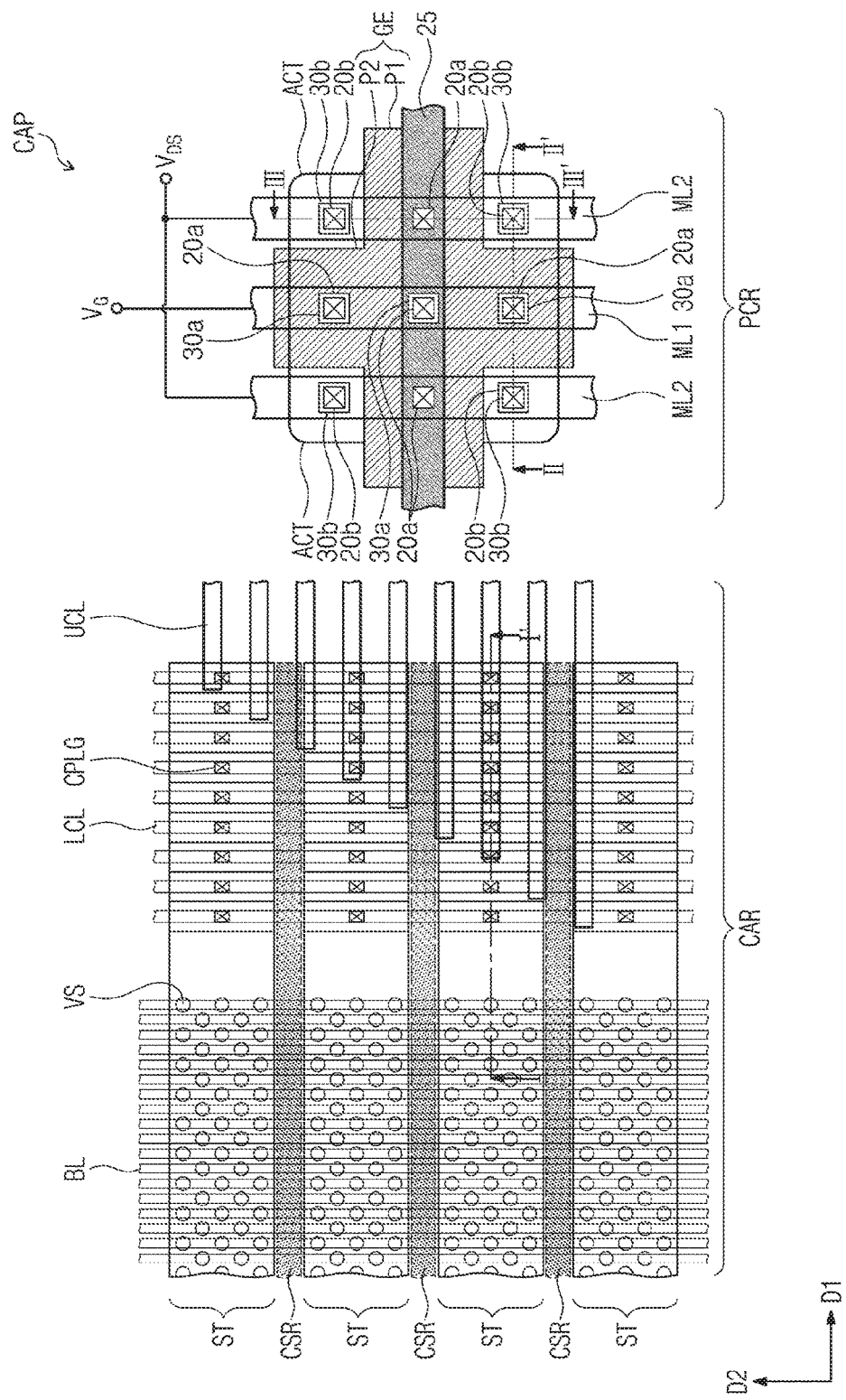
Figure 5:
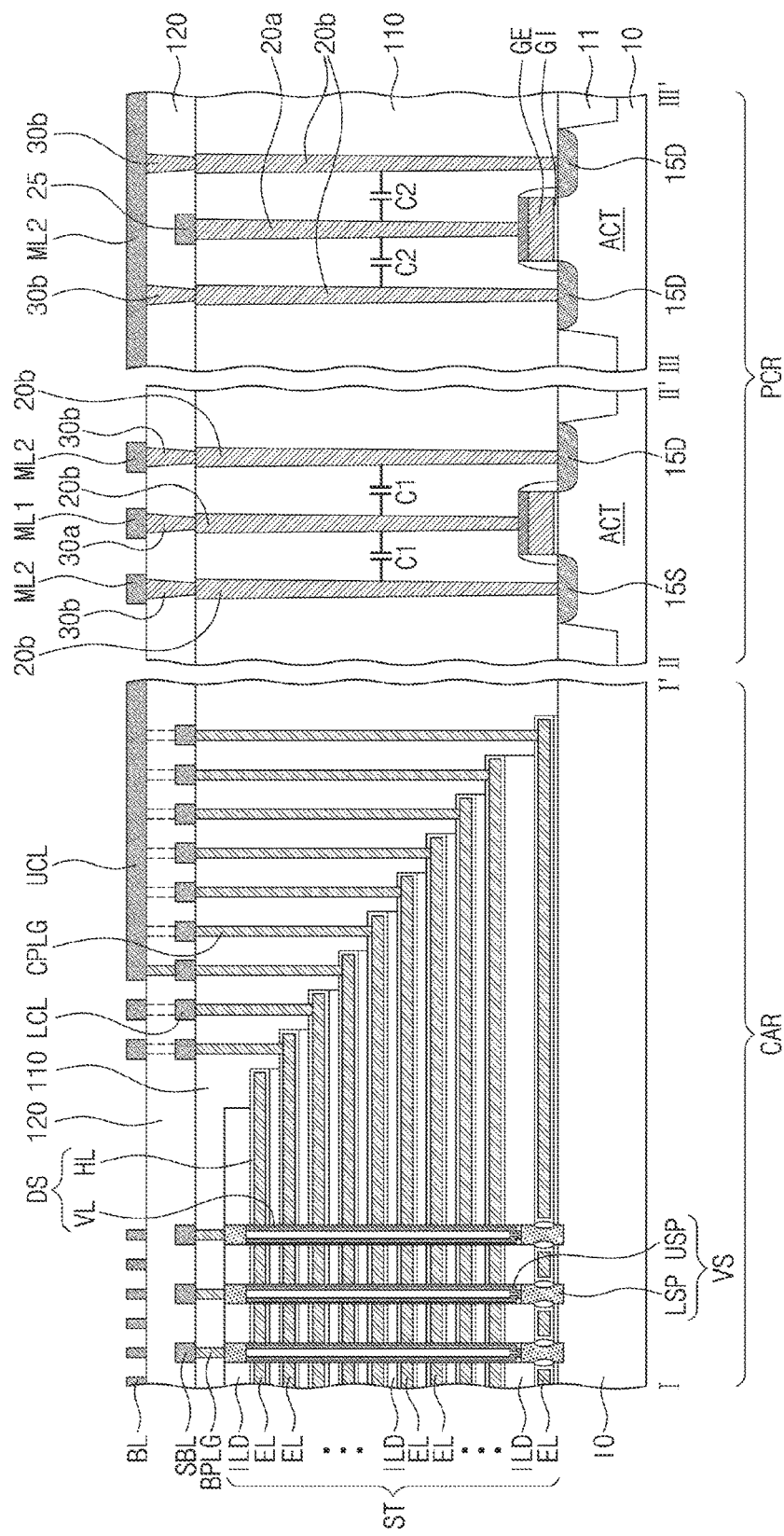
FIG. 5 is a cross-sectional view taken along lines I-I', II-II' and III-III' of FIG. 4.
Figure 6:
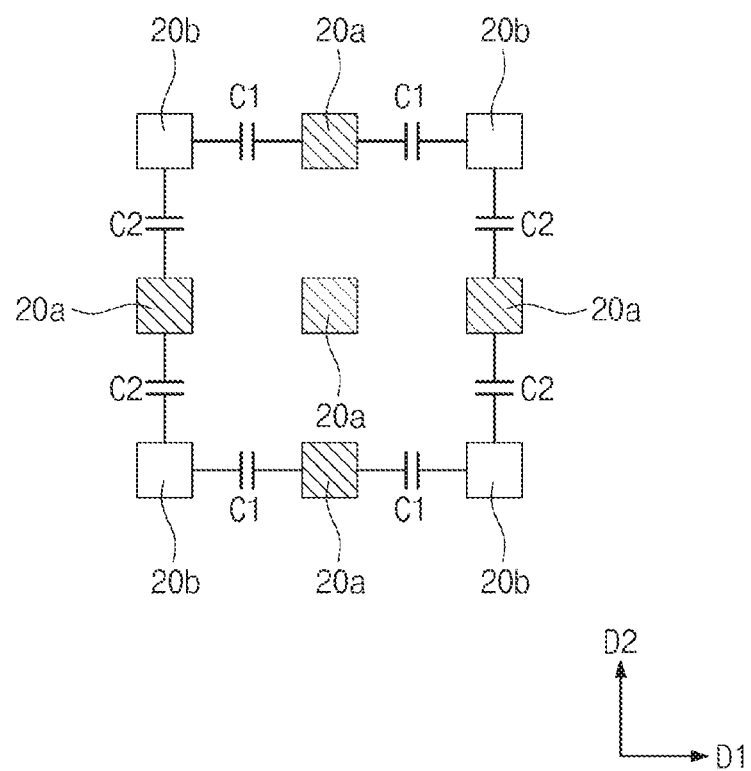
FIG. 6 is a simplified schematic diagram for explaining a power capacitor structure shown in FIGS. 1 to 5.

FIGS. 1 and 4 are plan views illustrating a semiconductor device according to some example embodiments of inventive concepts. FIGS. 2 and 3 are cross-sectional views taken along lines I-I', II-II' and III-III' of FIG. 1. FIG. 5 is a cross-sectional view taken along lines I-I', II-II' and III-III' of FIG. 4. FIG. 6 is a simplified schematic diagram for explaining a power capacitor structure shown in FIGS. 1 to 5.

Referring to FIGS. 1 and 2, a substrate 10 may include a cell array region CAR and a peripheral circuit region PCR. The substrate 10 may be one of a material (e.g., a silicon wafer) having semiconductor characteristics, an insulating material (e.g., glass), a semiconductor covered with an insulating material, and a conductor. For example, the substrate 10 may be a silicon wafer having a first conductive type.

A cell array may be disposed on the cell array region CAR. In some example embodiments, the cell array may include a plurality of memory cells that are three-dimensionally arranged on the substrate 10, and word lines and bit lines electrically connected to the memory cells. For example, the cell array may include a plurality of NAND cell strings, which may include (or consist of) a ground select transistor coupled to a common source line, a string select transistor coupled to the bit line, and a plurality of memory cells disposed between the ground and string select transistors. For example, in some example embodiments, the NAND strings may be vertically oriented such that at least one memory cell is located over another memory cell. The at least one memory cell may include a charge trap layer. The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

In more detail, the cell array of the cell array region CAR may include electrode structures ST, a plurality of vertical structures VS penetrating the electrode structures ST, data storage layers DS disposed between the electrode structures ST and the vertical structures VS, and bit lines BL running across the electrode structures ST and electrically connected to the vertical structures VS.

The electrode structures ST may extend in a first direction D1 and be disposed spaced apart from each other in a second direction D2 on the cell array region CAR. Each of the electrode structures ST may include electrodes EL and insulation layers ILD that are vertically and alternately stacked on the substrate 10.

The electrode structures ST may have a stepwise structure at an edge of the cell array region CAR in order to electrically connect the electrodes EL to a peripheral circuit (e.g., a row decoder). For example, the electrode structures ST may have a stepwise structure that descends along the first direction D1.

The plurality of vertical structures VS may penetrate the electrode structures ST on the cell array region CAR. The vertical structures VS may include a semiconductor material or a conductive material. In plan view, the vertical structures VS may be arranged in a zigzag or matrix manner. In some example embodiments, a contact pad coupled to a contact plug may be provided on top of the vertical structure VS.

In some example embodiments, each of the vertical structures VS may include a lower semiconductor pattern LSP and an upper semiconductor pattern USP. The lower semiconductor pattern LSP may penetrate a lower portion of the vertical structure VS to connect with the substrate 10, and the upper semiconductor pattern USP may penetrate an upper portion of vertical structure VS to connect with the lower semiconductor pattern LSP. The lower and upper semiconductor patterns LSP and USP may include silicon (Si), germanium (Ge), or a combination thereof, and may have different crystal structures from each other. The lower and upper semiconductor patterns LSP and USP may have a crystal structure including at least one of a single crystalline structure, an amorphous structure, and a polycrystalline structure. The lower and upper semiconductor patterns LSP and USP may be undoped or doped with an impurity whose conductivity is the same as that of the substrate 10. The lower semiconductor pattern LSP may be a pillar-shaped epitaxial layer, and the upper semiconductor pattern USP may be a hollow pipe- or macaroni-shaped polysilicon layer. In some example embodiments, the lower semiconductor patterns LSP may be omitted and the upper semiconductor patterns USP may be directly connected to the substrate 10.

The data storage layers DS may be disposed between the electrode structures ST and the vertical structures VS. The data storage layer DS may be a memory element of a NAND Flash memory device and may include a tunnel insulation layer, a charge storage layer, and a blocking insulation layer. Data stored in the data storage layer DS may be changed using Fouler-Nordheim tunneling induced by a voltage difference between the electrodes EL and the vertical structure VS that includes a semiconductor material. Alternatively, the data storage layer DS may include a thin film for a phase change memory or variable resistance memory.

The data storage layer DS may include a vertical insulation layer VL penetrating the electrode structure ST and a horizontal insulation layer HL extending toward top and bottom surfaces of the electrodes EL from between the electrodes EL and the vertical insulation layer VL.

The vertical insulation layer VL may include a portion (e.g., a tunnel insulation layer, a charge storage layer) of a data storage layer of a NAND Flash memory device. For example, the charge storage layer may be an insulation layer including a trap insulation layer or conductive nano-dots. Alternatively, the vertical insulation layer VL may include a thin film for a phase change memory or variable resistance memory. The horizontal insulation layer HL may be a portion (e.g., a tunnel insulation layer, a blocking insulation layer) of a data storage layer of a NAND Flash memory device.

A common source region CSR may be provided in the substrate 10 between the electrode structures ST. The common source region CSR may extend parallel to the electrode structures ST in the first direction D1. The common source region CSR may be formed by doping the substrate 10 with a second conductive type impurity. The common source region CSR may include, for example, an n-type impurity (e.g., arsenic (As) or phosphor (P)).

Sub-bit lines SBL may be disposed on a first interlayer dielectric layer 110 covering the electrode structures ST, and bit lines BL may be disposed on a second interlayer dielectric layer 120 covering the sub-bit lines SBL. The sub-bit lines SBL may be electrically connected through bit line contact plugs BPLG to the vertical structures VS. The bit lines BL may extend in the second direction D2 while running across the electrode structures ST and be electrically connected to the sub-bit lines SBL. Alternatively, in some example embodiments, no sub-bit lines SBL may be provided, and the bit lines BL may be electrically connected through the bit line contact plugs BPLG to the vertical structures VS.

In some example embodiments, the electrodes EL of the electrode structures ST may have their own ends that are coupled to cell contact plugs CPLG, lower connect lines LCL, and upper connect lines UCL. The cell contact plugs CPLG may penetrate the first interlayer dielectric layer 110 covering the electrodes structures ST and thus may be coupled to corresponding electrodes EL. The cell contact plugs CPLG may have vertical lengths that increase with approaching the peripheral circuit region PCR and have top surfaces substantially coplanar with each other.

The lower connect lines LCL may extend in the second direction D2 on the first interlayer dielectric layer 110 and may electrically connect the electrodes EL in common that are positioned at the same level from the substrate 10. The upper connect lines UCL may extend in the first direction D1 while running across the lower connect lines LCL on the second interlayer dielectric layer 120 covering the lower connect lines LCL. The upper connect lines UCL may be electrically connected through contact plugs (not shown) to corresponding lower connect lines LCL.

Peripheral logic circuits may be provided on the peripheral circuit region PCR of the substrate 10. The peripheral logic circuits may include row and column decoders for writing and reading data in memory cells, a page buffer, and control circuits. The peripheral logic circuits may include memory cells, NMOS and PMOS transistors, a resistor, and a capacitor.

In some example embodiments, the peripheral circuit region PCR may be provided thereon with a power capacitor structure CAP for filtering noise present on power and ground voltages that are applied when a semiconductor memory device is operated. The power capacitor structure CAP may include a MOS capacitor and vertical capacitors C1 and C2.

The MOS capacitor may include a gate electrode GE on the peripheral circuit region PCR, a gate dielectric layer GI between the gate electrode GE and the substrate 10, and source/drain impurity regions 15S and 15D in the substrate 10 adjacent to the gate electrode GE.

In more detail, the peripheral circuit region PCR may be provided therein with a device isolation layer 11 defining active areas ACT. The gate electrode GE may run across the active area ACT, and the gate dielectric layer GI may be disposed between the gate electrode GE and the active area ACT. The source/drain impurity regions 15S and 15D may be disposed in the active area ACT on opposite sides of the gate electrode GE.

The gate electrode GE may include at least one of doped semiconductor, metal (e.g., tungsten, titanium, tantalum, etc.), conductive metal nitride (e.g., titanium nitride, tantalum nitride, etc.), and metal-semiconductor compound (e.g., titanium silicide, tungsten silicide, nickel silicide, etc.). The gate dielectric layer GI may be formed of a high-k dielectric layer such as hafnium oxide, hafnium silicate, zirconium oxide, or zirconium silicate. The source/drain impurity regions 15S and 15D may include n-type or p-type impurities.

In some example embodiments, in plan view, the gate electrode GE may include a first part P1 extending in the first direction D1 and a second part P2 extending in the second direction D2. The source/drain impurity regions 15S and 15D may be disposed in the active area ACT on opposite sides of each of the first and second parts P1 and P2. In other words, the gate electrode GE may be disposed between the source/drain impurity regions 15S and 15D adjacent to each other in the first direction D1 and between the source/drain impurity regions 15S and 15D adjacent to each other in the second direction D2.

In some example embodiments, the gate electrode GE may be covered with the first interlayer dielectric layer 110, overlying the electrode structures ST of the cell array region CAR, which extends onto the peripheral circuit region PCR. The first interlayer dielectric layer 110 may have a thickness greater than that of the electrode structure ST and have a top surface positioned above that of the electrode structure ST (or that of an uppermost electrode EL).

The first interlayer dielectric layer 110 may be penetrated with first lower plugs 20a that are coupled to the gate electrode GE and with second lower plugs 20b that are coupled to corresponding source/drain impurity regions 15S and 15D. The first and second lower plugs 20a and 20b may include at least one of doped semiconductor, metal (e.g., tungsten, titanium, tantalum, etc.), conductive metal nitride (e.g., titanium nitride, tantalum nitride, etc.), and metal-semiconductor compound (e.g., titanium silicide, tungsten silicide, nickel silicide, etc.).

In more detail, the first lower plugs 20a may be coupled to the first and second parts P1 and P2 of the gate electrode GE and also be coupled to an intersection between the first and second parts P1 and P2. In plan view, one or more of the first lower plugs 20a may be disposed between the second lower plugs 20b adjacent to each other in the first direction D1 and between the second lower plugs 20b adjacent to each other in the second direction D2.

The second interlayer dielectric layer 120 may cover the first interlayer dielectric layer 110 of the cell array and peripheral circuit regions CAR and PCR. The second interlayer dielectric layer 120 may cover top surfaces of the first and second lower plugs 20a and 20b of the peripheral circuit region PCR.

First and second power lines ML1 and ML2 may extend in the second direction D2 on the second interlayer dielectric layer 120. In some example embodiments, the first and second power lines ML1 and ML2 may be spaced apart from each other in the first direction D1, and the second power lines ML2 may be disposed on opposite sides of the first power line ML1. For example, the first power line ML1 may be supplied with a power voltage VG, and the second power lines ML2 may be supplied with a ground voltage VDS.

In some example embodiments, the first power line ML1 may be provided thereunder with first upper plugs 30a that electrically connect the first power line ML1 to the first lower plugs 20a. No first upper plugs 30a may be provided between the second power lines ML2 and the first lower plugs 20a. That is, the first power line ML1 may be electrically connected to the gate electrode GE through the first lower plugs 20a and the first upper plugs 30a. The first lower plugs 20a positioned below the second power lines ML2 may be electrically connected through the gate electrode GE to the first power line ML1.

The second power lines ML2 may be provided thereunder with second upper plugs 30b that electrically connect the second power lines ML2 to the second lower plugs 20b. In other words, one of the second power lines ML2 may be electrically connected to the source impurity regions 15S through the second lower plugs 20b and the second upper plugs 30b, and another of the second power lines ML2 may be electrically connected to the drain impurity regions 15D through the second lower plugs 20b and the second upper plugs 30b.

As the gate electrode GE is connected to the first power line ML1 and the source/drain impurity regions 15S and 15D are connected to the second power lines ML2, a first terminal of the MOS capacitor may be formed by (or constituted by) the gate electrode GE and a second terminal of the MOS capacitor may be formed by (or constituted by) the source/drain impurity regions 15S and 15D and a channel below the gate electrode GE.

In some example embodiments, the first power line ML1 may be electrically connected to the first lower plugs 20a such that the power voltage VG may be applied to the first lower plugs 20a, and the second power lines ML2 may be electrically connected to the second lower plugs 20b such that the ground voltage VDS may be applied to the second lower plugs 20b. In some example embodiments, as each of the second lower plugs 20b is disposed adjacent to the first lower plugs 20a in the first and second directions D1 and D2, the first and second lower plugs 20a and 20b adjacent to each other may be used as electrodes of the vertical capacitors C1 and C2. In some example embodiments, the vertical capacitors C1 and C2 may have capacitance whose value is dependent upon vertical lengths of the first and second lower plugs 20a and 20b, a spacing between the first and second lower plugs 20a and 20b adjacent to each other, and a dielectric constant of the first interlayer dielectric layer 110. The vertical length of the first and second lower plugs 20a and 20b may increase with a vertical thickness of the electrode structure ST of the cell array region CAR. The spacing between the first and second lower plugs 20a and 20b may decrease with increasing of integration of a three-dimensional semiconductor device.

In detail, referring to FIGS. 2 and 6, as the first lower plug 20a is disposed between the second lower plugs 20b adjacent to each other in the first direction D1, first vertical capacitors C1 may be formed by (or constituted by) the first and second lower plugs 20a and 20b adjacent to each other in the first direction D1. In addition, as the first lower plug 20a is disposed between the second lower plugs 20b adjacent to each other in the second direction D2, second vertical capacitors C2 may be formed by (or constituted by) the first and second lower plugs 20a and 20b adjacent to each other in the second direction D2. The first and second vertical capacitors C1 and C2 may be electrically connected in parallel, so that it may be possible to increase capacitance of the power capacitor structure CAP including the first and second lower plugs 20a and 20b. As power capacitance is thus securely obtained within a limited area, a stable power may be provided to a three-dimensional semiconductor device.

Referring to FIGS. 1 and 3, the electrode structure ST of the cell array region CAR may include a lower electrode structure LST and an upper electrode structure UST on the lower electrode structure LST.

The substrate 10 may be provided thereon with the lower electrode structure LST including a plurality of vertically stacked lower electrodes EL1 with insulation layers ILD therebetween, and the lower electrode structure LST may be provided thereon with the upper electrode structure UST including a plurality of vertically stacked upper electrodes EL2 with insulation layers ILD therebetween.

In some example embodiments, the first interlayer dielectric layer 110 may cover a stepwise section of the lower electrode structure LST, and on the first interlayer dielectric layer 110, the second interlayer dielectric layer 120 may cover a stepwise section of the upper electrode structure UST. The first interlayer dielectric layer 110 and silicon interlayer dielectric layer 120 may each be formed of an insulating material (e.g., silicon oxide). A material and/or density of the second interlayer dielectric layer 120 may be the same as or different than a material and/or density of the first interlayer dielectric layer 110.

The lower electrodes EL1 may have their own ends coupled to corresponding lower cell plugs CPLG1, each of which may include a first plug PLG1 penetrating the first interlayer dielectric layer 110 and a second plug PLG2 penetrating the second interlayer dielectric layer 120 to connect with the first plug PLG1. The upper electrodes EL2 may have their own ends coupled to corresponding upper cell plugs CPLG2 penetrating the second interlayer dielectric layer 120.

In some example embodiments shown in FIG. 3, each of the first lower plugs 20a may include a first contact LCPa penetrating the first interlayer dielectric layer 110 to couple with the gate electrode GE and a second contact UCPa penetrating the second interlayer dielectric layer 120 to couple with the first contact LCPa. Each of the second lower plugs 20b may include a first contact LCPb penetrating the first interlayer dielectric layer 110 to couple with one of the source/drain impurity regions 15S and 15D and a second contact UCPb penetrating the second interlayer dielectric layer 120 to couple with the first contact LCPb.

Referring to FIGS. 4 and 5, an intermediate line 25 may further be provided to extend in the first direction D1 on the first interlayer dielectric layer 110. The intermediate line 25 may be coupled to the first lower plugs 20a arranged along the first direction D1 and electrically connected to the first power line ML1 through the first lower plugs 20a and the gate electrode GE. In some example embodiments, the intermediate line 25 may be positioned at the same level as that of the lower connect lines LCL disposed on the cell array region CAR. The intermediate line 25 may be formed of an electrically-conductive material (e.g., metal, metal alloy).

Figure 7:
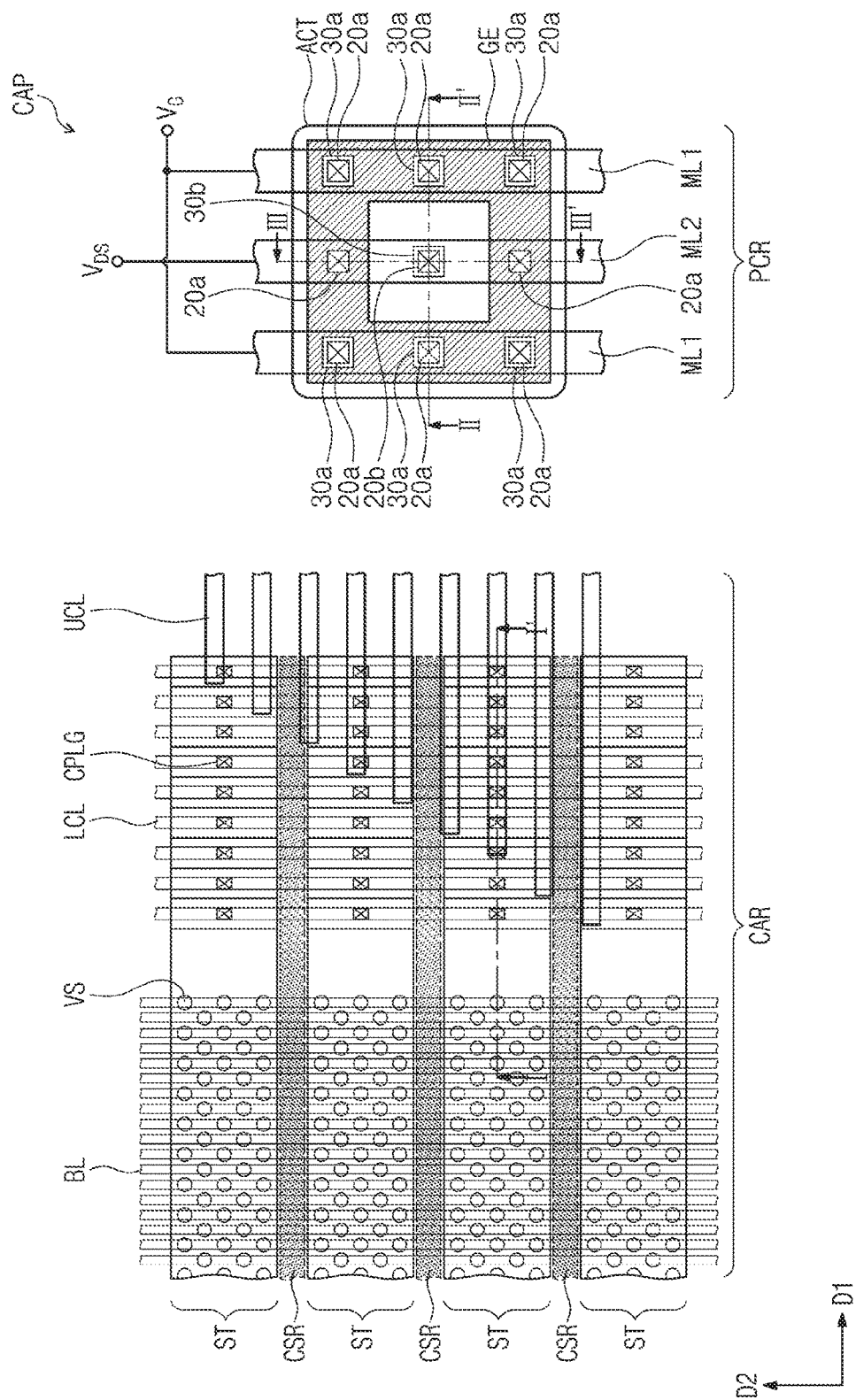
FIGS. 7 and 9 are plan views illustrating a semiconductor device according to some example embodiments of inventive concepts.
Figure 8:
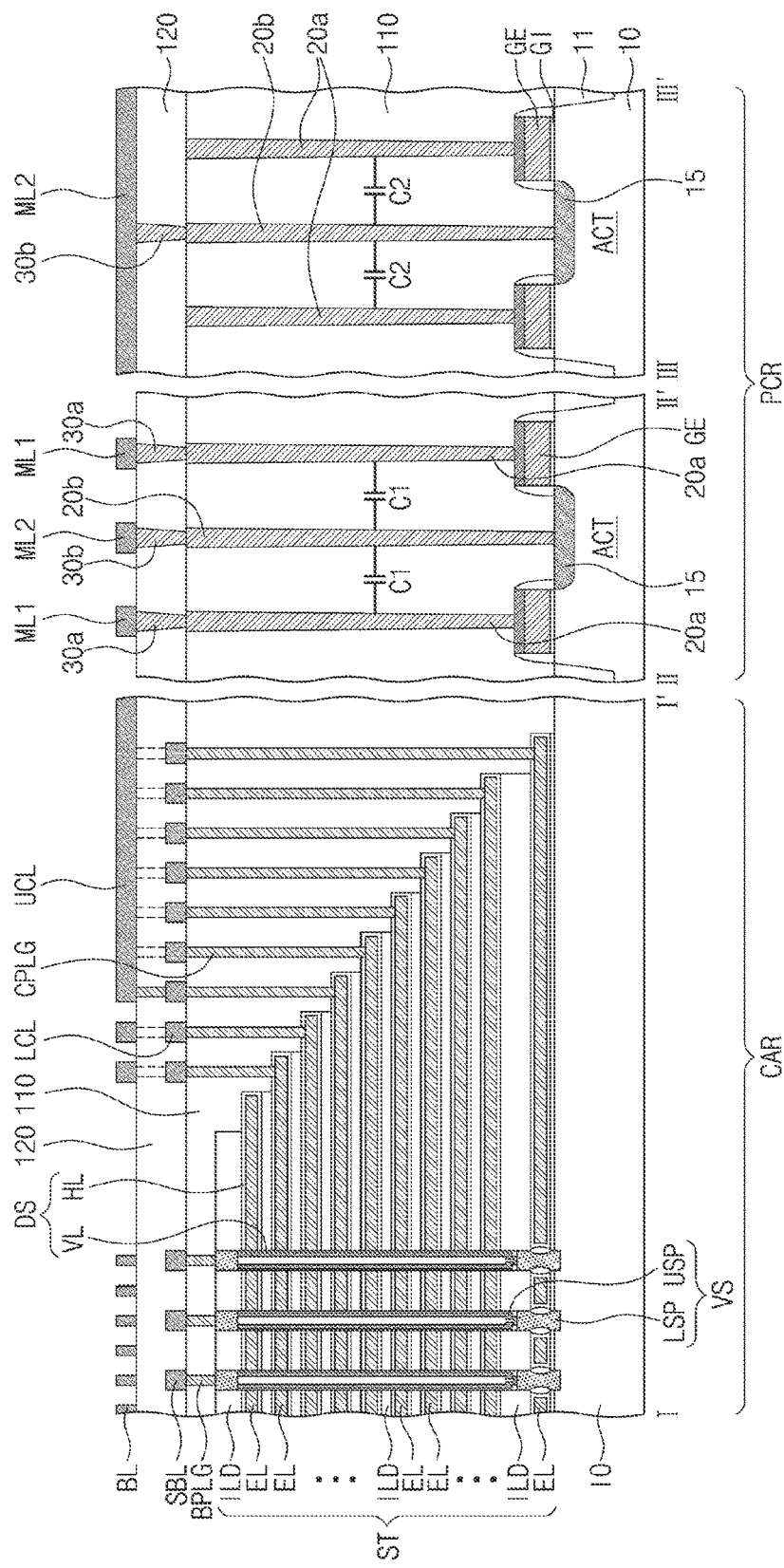
FIGS. 8 and 10 are cross-sectional views taken along lines I-I', II-II' and III-III' of FIGS. 7 and 9, respectively.
Figure 9:
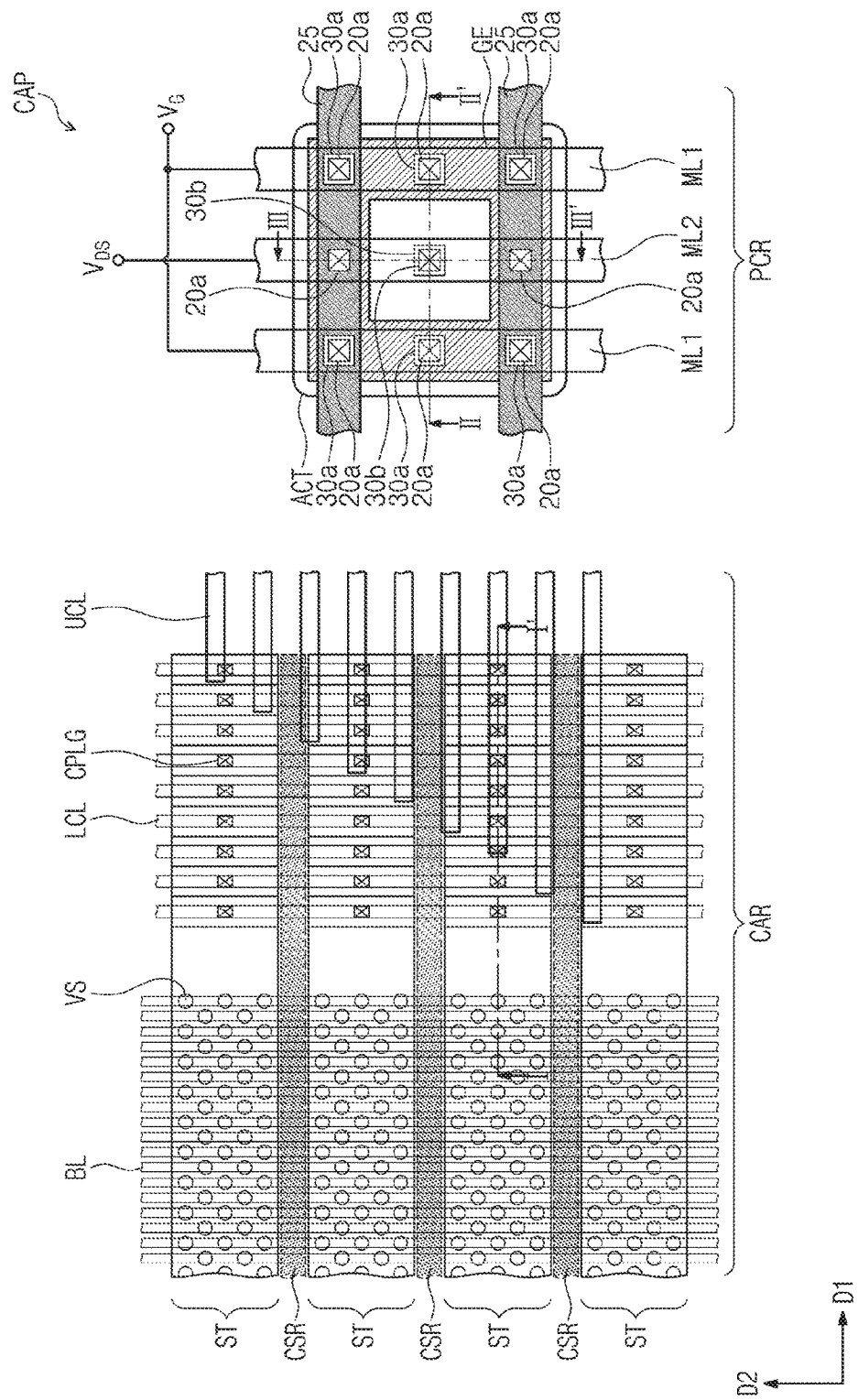
Figure 10:
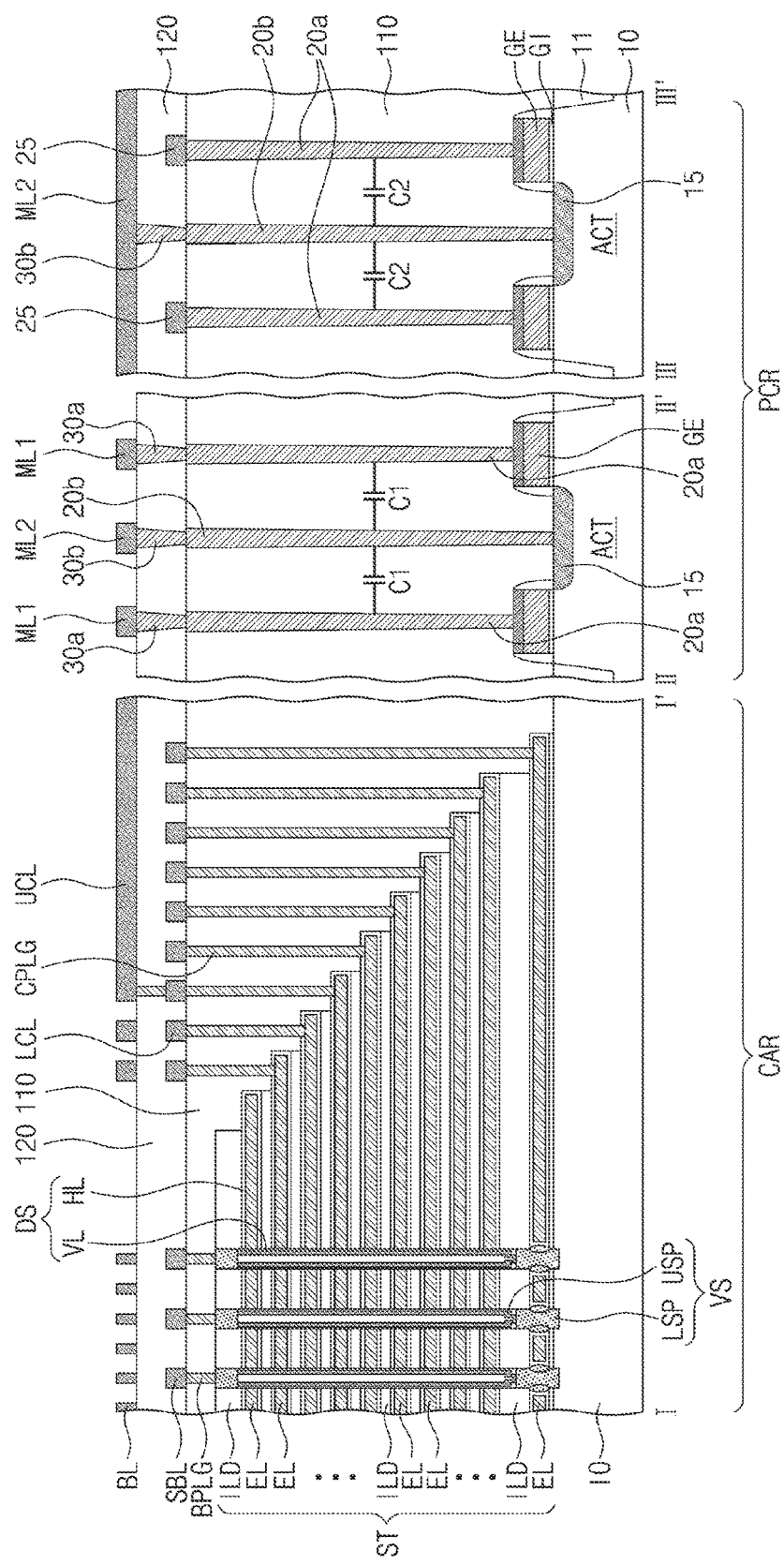
Figure 11:
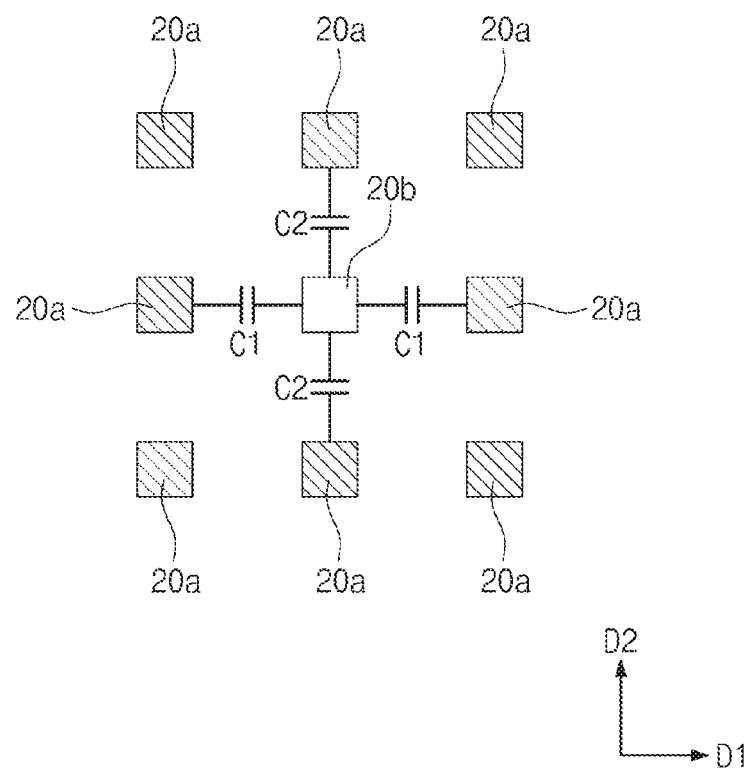
FIG. 11 is a simplified schematic diagram for explaining a power capacitor structure shown in FIGS. 7 to 10.

FIGS. 7 and 9 are plan views illustrating a semiconductor device according to some example embodiments of inventive concepts. FIGS. 8 and 10 are cross-sectional views taken along lines I-I', II-II' and III-III' of FIGS. 7 and 9, respectively. FIG. 11 is a simplified schematic diagram for explaining a power capacitor structure shown in FIGS. 7 to 10. For brevity of the description, the description of previously-described features will be omitted.

Referring to FIGS. 7 and 8, in plan view, a ring-shaped gate electrode GE may be disposed on the peripheral circuit region PCR. The gate electrode GE may have an opening that exposes a portion of the active area ACT. In detail, the gate electrode GE may include first parts extending in parallel in the first direction D1 and second parts extending in parallel in the second direction D2. A source/drain impurity region 15 may be disposed in the active area ACT exposed through the opening of the gate electrode GE.

The first lower plugs 20a may be arranged in the first and second directions D1 and D2 to couple with the gate electrode GE, and the second lower plugs 20b may couple with the source/drain impurity region 15.

The first and second power lines ML1 and ML2 may extend in parallel in the second direction D2 on the second interlayer dielectric layer 120, and the first power lines ML1 may be disposed on opposite sides of the second power line ML2.

Each of the first power lines ML1 may be provided thereunder with the first upper plugs 30a that connect the first lower plugs 20a to the first power line ML1. No first upper plugs 30a may be provided on the first lower plugs 20a positioned below the second power line ML2. That is, the first lower plugs 20a positioned below the second power line ML2 may be electrically connected through the gate electrode GE to the first power lines ML1. The second power line ML2 may be provided thereunder with the second upper plug 30b that connects the second lower plug 20b to the second power line ML2.

In some example embodiments, as shown in FIGS. 9 and 10, intermediate lines 25 may further be provided. On the first interlayer dielectric layer 110, each of the intermediate lines 25 may be coupled to the first lower plugs 20a arranged along the first direction D1. The intermediate lines 25 may extend in the first direction D1 while running across the ring-shaped gate electrode GE.

Referring to FIG. 11, in some example embodiments, the first lower plugs 20a may be electrically connected to the first power lines ML1, and the second lower plug 20b may be electrically connected to the second power line ML2. In other words, as discussed above, the power voltage VG may be applied to the first lower plugs 20a, and the ground voltage VDS may be applied to the second lower plug 20b. For example, the second lower plug 20b may be disposed between the first lower plugs 20a adjacent to each other in the first direction D1 and between the first lower plugs 20a adjacent to each other in the second direction D2. Accordingly, the first vertical capacitors C1 may be formed by (or constituted by) the second lower plug 20b together with the first lower plugs 20a arranged in the first direction D1, and the second vertical capacitors C2 may be formed by (or constituted by) the second lower plug 20b together with the first lower plugs 20a arranged in the second direction D2.

Figure 12:
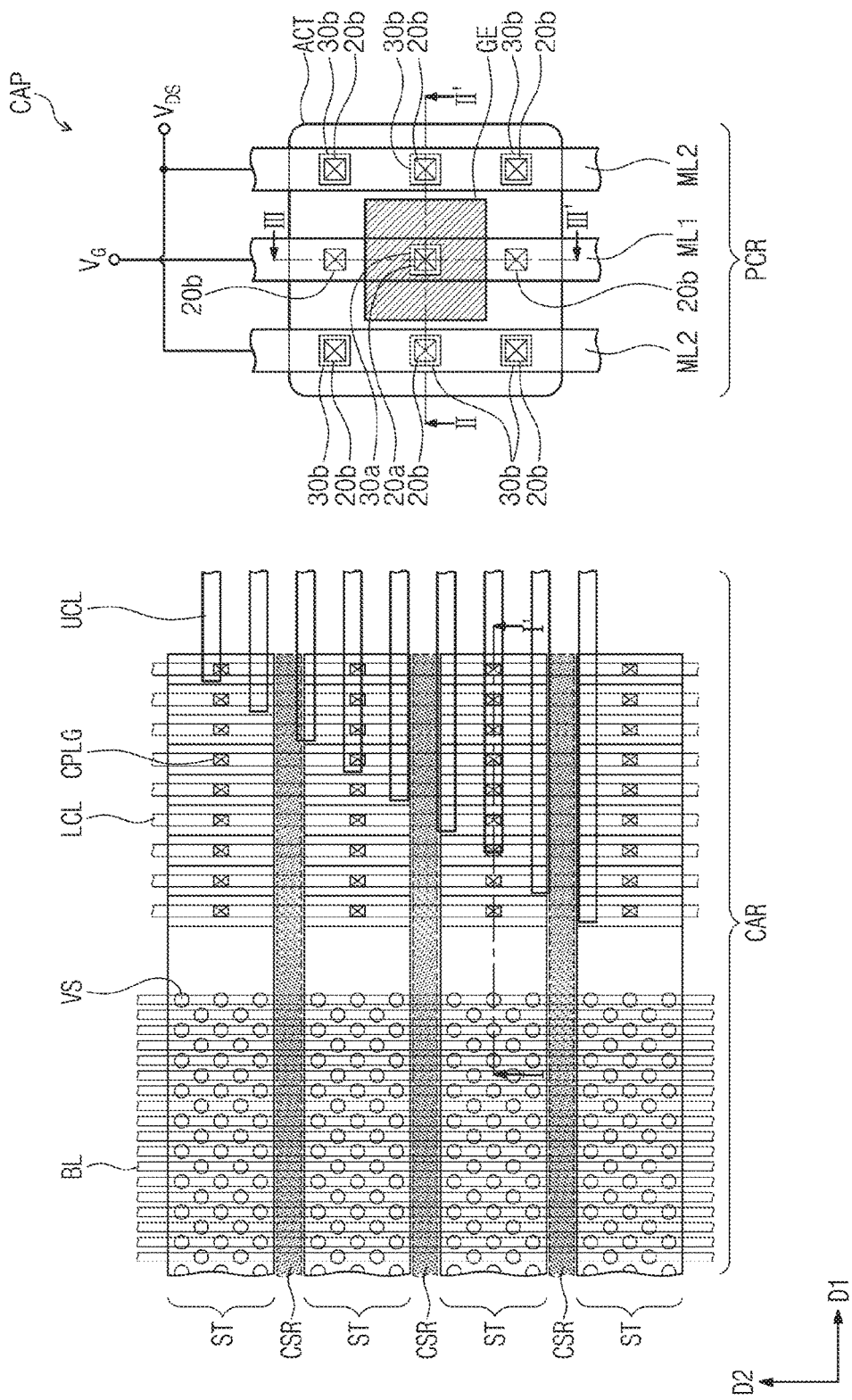
FIGS. 12 and 14 are plan views illustrating a semiconductor device according to some example embodiments of inventive concepts.
Figure 13:
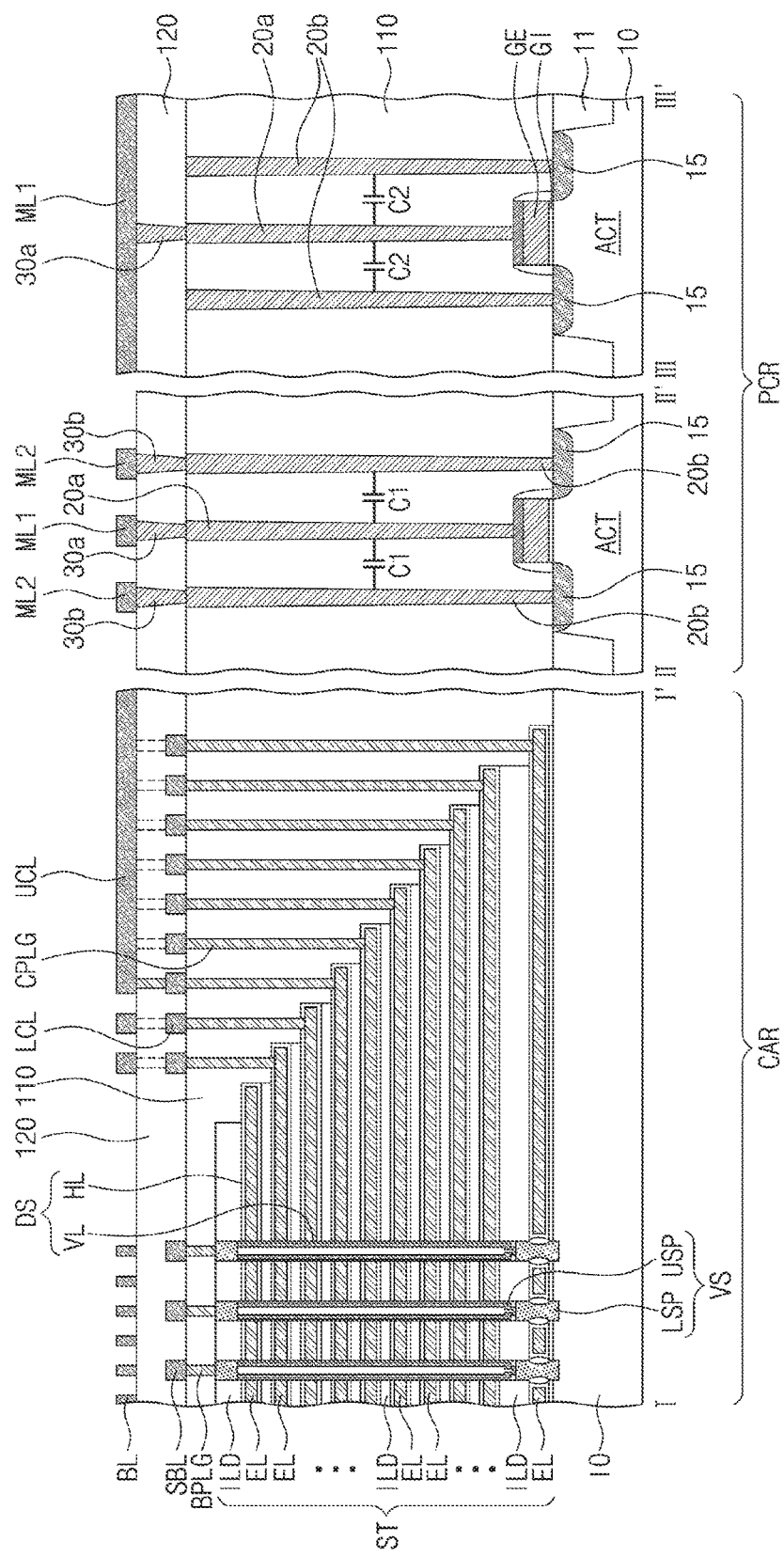
FIGS. 13 and 15 are cross-sectional views taken along lines I-I', II-II' and III-III' of FIGS. 12 and 14, respectively.
Figure 14:
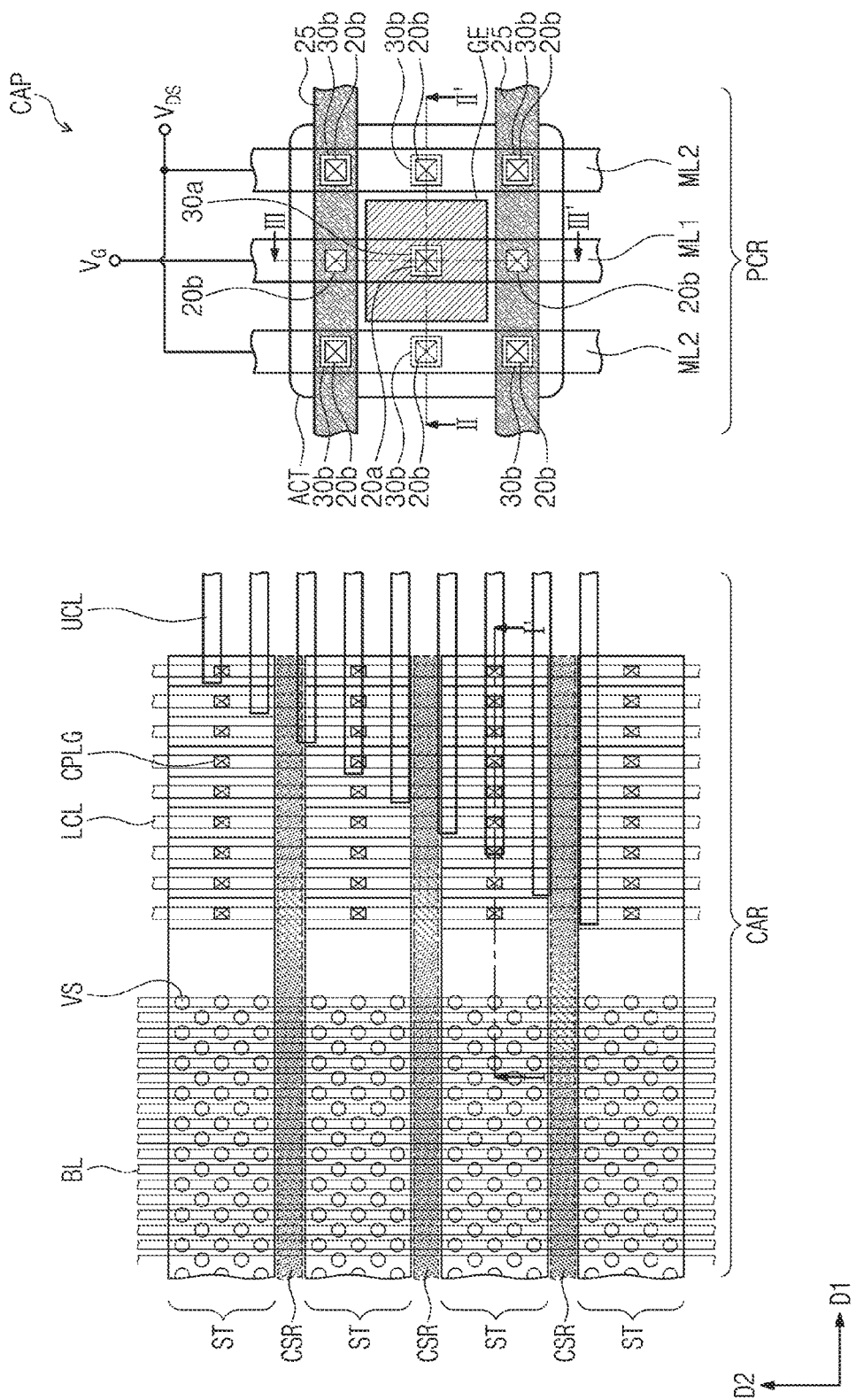
Figure 15:
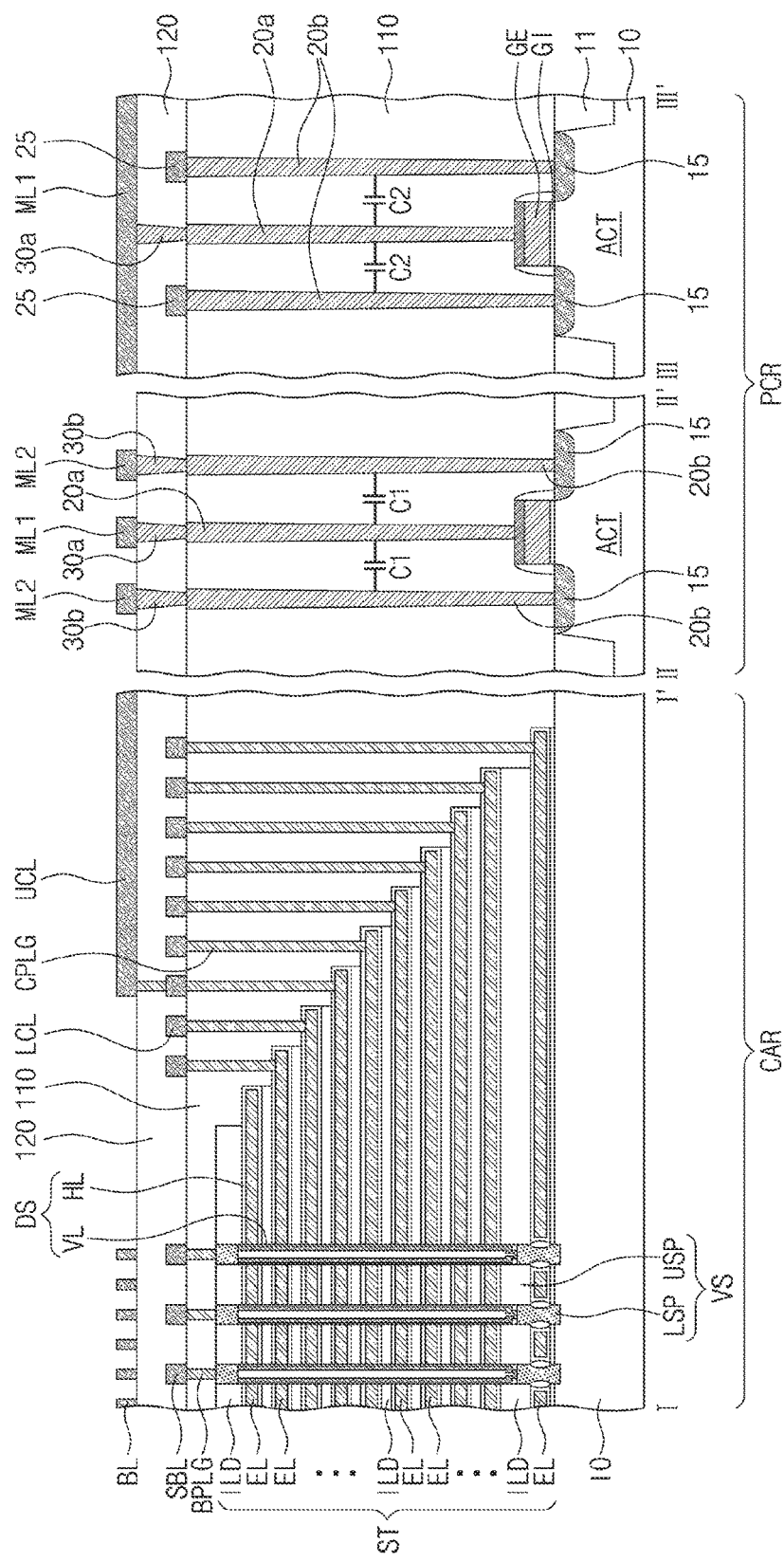
Figure 16:
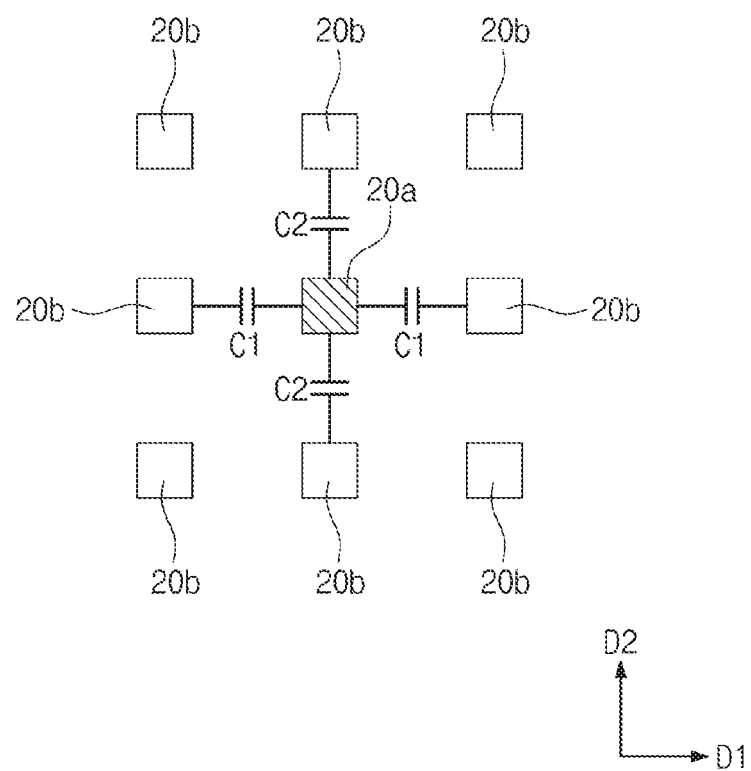
FIG. 16 is a simplified schematic diagram for explaining a power capacitor structure shown in FIGS. 12 to 15.

FIGS. 12 and 14 are plan views illustrating a semiconductor device according to some example embodiments of inventive concepts. FIGS. 13 and 15 are cross-sectional views taken along lines I-I', II-II' and III-III' of FIGS. 12 and 14, respectively. FIG. 16 is a simplified schematic diagram for explaining a power capacitor structure shown in FIGS. 12 to 15. For brevity of the description, the description of previously-described features will be omitted.

Referring to FIGS. 12 and 13, an island-shaped gate electrode GE may be disposed on the peripheral circuit region PCR. In plan view, the source/drain impurity region 15 may be disposed to surround the gate electrode GE. In detail, the source/drain impurity region 15 may be disposed on opposite sides of the gate electrode GE in the first direction D1 and also be disposed on other opposite sides of the gate electrode GE in the second direction D2.

The first lower plug 20a may penetrate the first interlayer dielectric layer 110 to couple with the gate electrode GE, and the second lower plugs 20b may be arranged in the first and second directions D1 and D2 to couple with the source/drain impurity region 15.

The first and second power lines ML1 and ML2 may extend in parallel in the second direction D2 on the second interlayer dielectric layer 120. The first power line ML1 may run across the gate electrode GE, and the second power lines ML2 may be disposed on opposite sides of the first power line ML1.

The first power line ML1 may be provided thereunder with the first upper plug 30a that electrically connects the first lower plug 20a to the first power line ML1. Each of the second power lines ML2 may be provided thereunder with the second upper plugs 30b that connect the second lower plugs 20b to the second power line ML2. No second upper plugs 30b may be provided on the second lower plugs 20b positioned below the first power line ML1. That is, the second lower plugs 20b positioned below the first power line ML1 may be electrically connected through the source/drain impurity region 15 to the second power lines ML2.

Referring to FIGS. 14 and 15, the intermediate lines 25 may extend in the first direction D1 while running across the source/drain impurity regions 15. On the first interlayer dielectric layer 110, each of the intermediate lines 25 may be coupled to the second lower plugs 20b arranged along the first direction D1.

Referring to FIG. 16, the first lower plug 20a may be electrically connected to the first power line ML1, and the second lower plugs 20b may be electrically connected to the second power lines ML2. In other words, as discussed above, the power voltage VG may be applied to the first lower plug 20a, and the ground voltage VDS may be applied to the second lower plugs 20b. For example, the first lower plug 20a may be disposed between the second lower plugs 20b adjacent to each other in the first direction D1 and between the second lower plugs 20b adjacent to each other in the second direction D2. Accordingly, the first vertical capacitors C1 may be formed by (or constituted by) the first lower plug 20a together with the second lower plugs 20b arranged in the first direction D1, and the second vertical capacitors C2 may be formed by (or constituted by) the first lower plug 20a together with the second lower plugs 20b arranged in the second direction D2.

Figure 17:
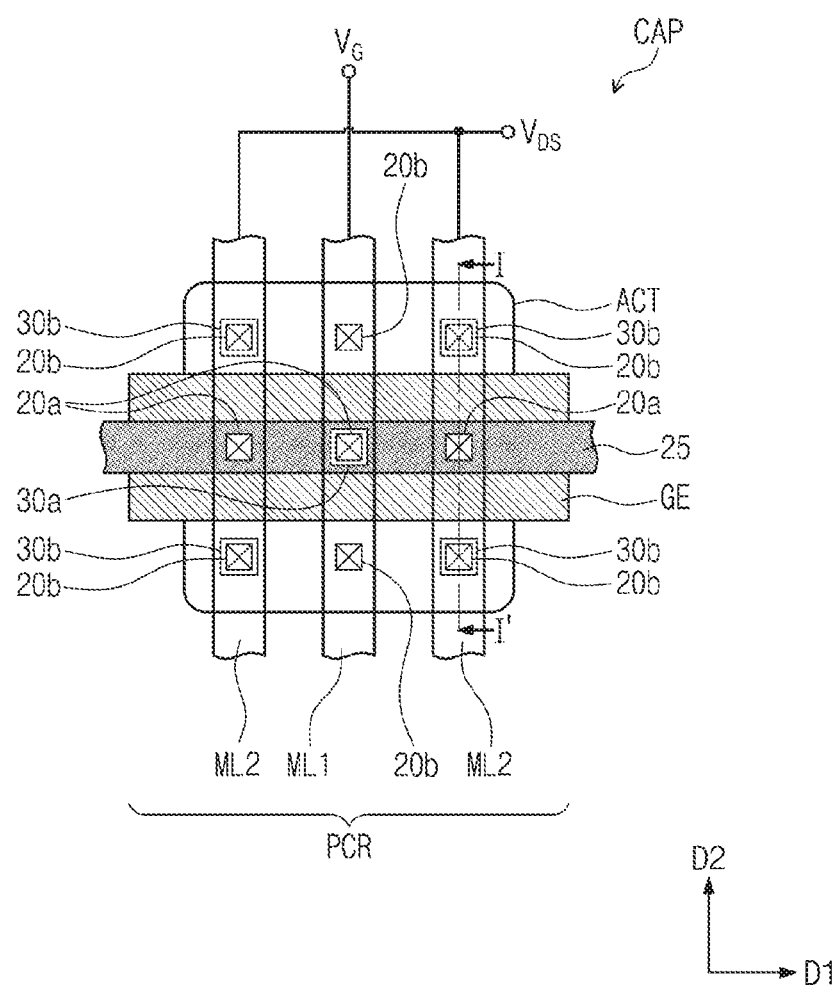
FIG. 17 is a plan view illustrating a semiconductor device according to some example embodiments of inventive concepts.
Figure 18:
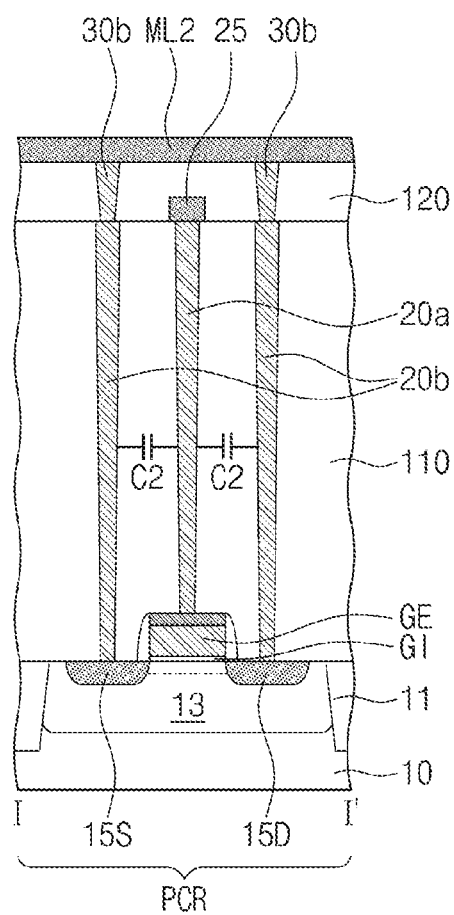
FIG. 18 is a cross-sectional view taken along line I-I' of FIG. 17.

FIG. 17 is a plan view illustrating a semiconductor device according to some example embodiments of inventive concepts. FIG. 18 is a cross-sectional view taken along line I-I' of FIG. 17.

Referring to FIGS. 17 and 18, the peripheral circuit region PCR may be provided thereon with the power capacitor structure CAP including a MOS capacitor and vertical capacitors. The MOS capacitor may include an n-type well 13 in the substrate 10 having p-type conductivity, n-type source/drain impurity regions 15S and 15D spaced apart from each other in the n-type well 13, a gate dielectric layer GI, and a gate electrode GE.

The n-type well 13 may be provided in the peripheral circuit region PCR. The device isolation layer 11 may define the active area ACT at the n-type well 13. The gate electrode GE may have a linear shape that runs across the active area ACT and extends in the first direction D1. The gate electrodes GE, as discussed above, may be changed to various shapes. The gate dielectric layer GI may be interposed between the n-type well 13 and the gate electrode GE. The n-type well 13 may be provided therein with the n-type source/drain impurity regions 15S and 15D disposed on opposite sides of the gate electrode GE. The n-type source/drain impurity regions 15S and 15D may have n-type impurities whose concentration is higher than that of the n-type well 13.

The first lower plugs 20a may penetrate the first interlayer dielectric layer 110 to couple with the gate electrode GE, and the second lower plugs 20b may penetrate the first interlayer dielectric layer 110 to couple with the source/drain impurity regions 15S and 15D.

On the first interlayer dielectric layer 110, the intermediate line 25 may be coupled to the first lower plugs 20a arranged along the first direction D1. The intermediate line 25 may be covered with the second interlayer dielectric layer 120 on the first interlayer dielectric layer 110.

The first power line ML1 and the second power lines ML2 may extend in the second direction D2 on the second interlayer dielectric layer 120. The first power line ML1 may be coupled to the intermediate line 25 through the first upper plug 30a penetrating the second interlayer dielectric layer 120. For example, the first power line ML1 may be supplied with a ground voltage (or a negative voltage VG), which may then be applied to the gate electrode GE through the first upper plug 30a, the intermediate line 25, and the first lower plugs 20a.

The second power lines ML2 may be coupled to corresponding second lower plugs 20b through the second upper plugs 30b penetrating the second interlayer dielectric layer 120. For example, the second power lines ML2 may be supplied with a power voltage (or a positive voltage VDS), which may then be applied to the source/drain impurity regions 15S and 15D through the second upper plugs 30b and the second lower plugs 20b.

In some example embodiments, the ground voltage (or the negative voltage VG) may be applied to the gate electrode GE, and the power voltage (or the positive voltage VDS) may be applied to the source/drain impurity regions 15S and 15D. Accordingly, electrodes present in the n-type well 13 below the gate electrode GE may be pushed away from the gate electrode GE, and a depletion layer filled with holes may be formed below the gate dielectric layer GI. There may be formed a capacitor by the gate dielectric layer GI and a capacitor by the depletion layer.

In addition, as the first lower plugs 20a are disposed between the second lower plugs 20b adjacent to each other in the second direction D2, the first and second lower plugs 20a and 20b adjacent to each other may be coupled to form a vertical capacitor C2 in the second direction D2.

Figure 19:
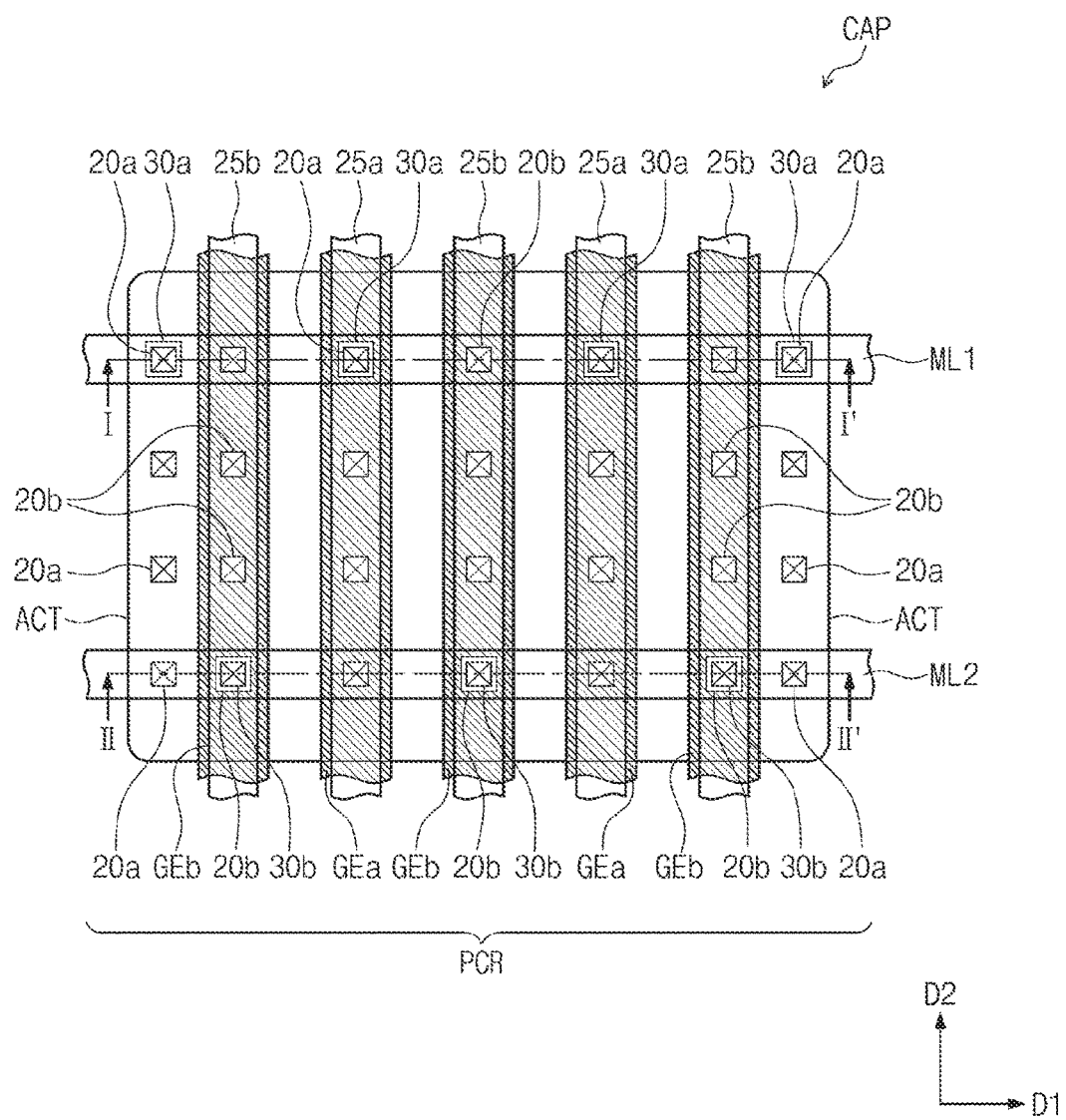
FIG. 19 is a plan view illustrating a semiconductor device according to some example embodiments of inventive concepts.
Figure 20:
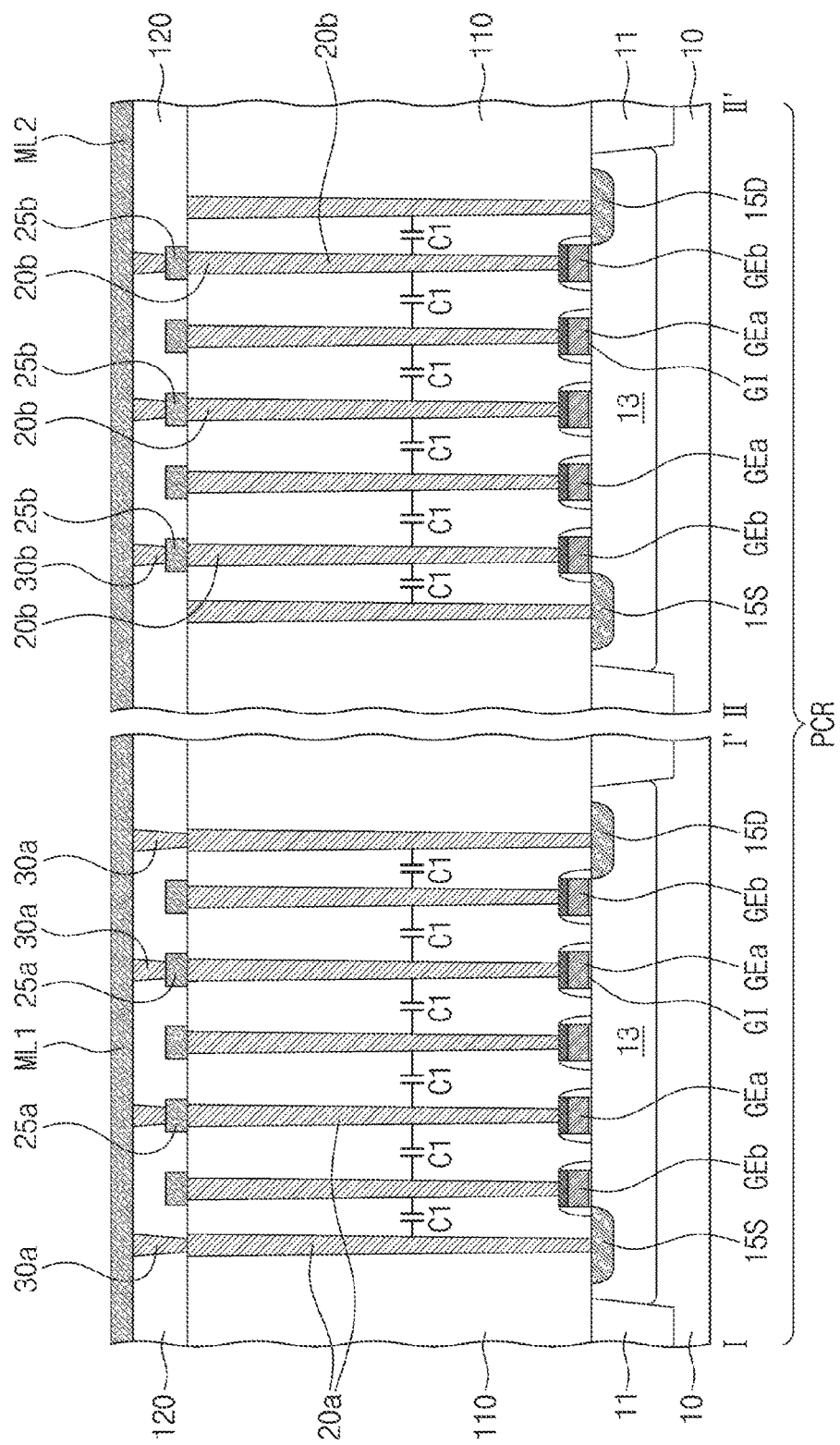
FIG. 20 is a cross-sectional view taken along lines I-I' and II-II' of FIG. 19.

FIG. 19 is a plan view illustrating a semiconductor device according to some example embodiments of inventive concepts. FIG. 20 is a cross-sectional view taken along lines I-I' and II-II' of FIG. 19. For brevity of the description, the description of previously-described features will be omitted.

Referring to FIGS. 19 and 20, the peripheral circuit region PCR may be provided thereon with the power capacitor structure CAP including a MOS capacitor and vertical capacitors. The MOS capacitor may include an n-type well 13 in the substrate 10 having p-type conductivity, n-type source/drain impurity regions 15S and 15D spaced apart from each other in the n-type well 13, a plurality of gate electrodes GEa and GEb, and gate dielectric layers GI.

The n-type well 13 may be provided in the peripheral circuit region PCR. The device isolation layer 11 may define the active area ACT at the n-type well 13. The gate electrodes GEa and GEb may have a linear shape that runs across the active area ACT and extends in the second direction D2. In some example embodiments, the first and second gate electrodes GEa and GEb may be disposed spaced apart from each other between the source/drain impurity regions 15S and 15D. The first and second gate electrodes GEa and GEb may be alternately disposed in the first direction D1. The gate dielectric layers GI may be provided between the substrate 10 and the gate electrodes GEa and GEb.

The first lower plugs 20a may penetrate the first interlayer dielectric layer 110 to couple with the first gate electrodes GEa and the source/drain impurity regions 15S and 15D. The second lower plugs 20b may penetrate the first interlayer dielectric layer 110 to couple with the second gate electrodes GEb. In plan view, the first and second lower plugs 20a and 20b may be alternately arranged in the first direction D1.

The first interlayer dielectric layer 110 may be provided thereon with first intermediate lines 25a that correspond to the first gate electrodes GEa and also with second intermediate lines 25b that correspond to the second gate electrodes GEb.

The first power line ML1 and the second power line ML2 may extend in the first direction D1 on the second interlayer dielectric layer 120.

The first upper plugs 30a may connect the first lower plugs 20a to the first power line ML1, and the second upper plugs 30b may connect the second lower plugs 20b to the second power line ML2. For example, the first power line ML1 may be supplied with a power voltage (or a positive voltage), and the second power line ML2 may be supplied with a ground voltage (or a negative voltage). That is, the power voltage may be applied to the first gate electrodes GEa and the source/drain impurity regions 15S and 15D, and the ground voltage may be applied to the second gate electrodes GEb. Accordingly, the n-type well 13 may be provided therein with depletion layers below corresponding second gate electrodes GEb. To put it another way, a capacitor by the gate dielectric layer GI and a capacitor by the depletion layer may be formed between the n-type well 13 and the second gate electrodes GEb.

Moreover, as the first lower plugs 20a are electrically connected to the first power line ML1 and the second lower plugs 20b are electrically connected to the second power line ML2, the first and second lower plugs 20a and 20b adjacent to each other may form vertical capacitors C1 in the first direction D1.

According to some example embodiments of inventive concepts, a power capacitor structure may include a MOS capacitor and a plurality of vertical capacitors. The vertical capacitors may include first lower plugs coupled to a first terminal of the MOS capacitor and second lower plugs coupled to a second terminal of the MOS capacitor. A plurality of pairs of adjacent first and second contact plugs may constitute vertical capacitors in first and second directions. The vertical capacitors in the first and second directions may be electrically connected in parallel such that it may be possible to increase capacitance of the power capacitor structure. Accordingly, as capacitance of the power capacitor structure increases within a limited area, stable power may be provided to a three-dimensional semiconductor device.

Although some example embodiments of inventive concepts have been described, the described embodiments are for illustrative purposes only, not for purpose of limitation. It will be understood to those skilled in the art that various changes and modifications may be made without departing from spirit and scope of the claims.

What is claimed is:

1. A three-dimensional semiconductor device, comprising:
   a semiconductor substrate including a cell array region and a peripheral circuit region;
   an electrode structure on the semiconductor substrate, the electrode structure including a plurality of electrodes that are vertically stacked on the cell array region;
   a MOS capacitor on the peripheral circuit region;
   an interlayer dielectric layer covering the electrode structure and the MOS capacitor;
   a first power line and a second power line on the interlayer dielectric layer, the first power line and the second power line being spaced apart from each other in a first direction and extending in a second direction intersecting the first direction;
   a plurality of first lower plugs penetrating the interlayer dielectric layer, the plurality of first lower plugs being connected to the first power line and a first terminal of the MOS capacitor; and
   a plurality of second lower plugs penetrating the interlayer dielectric layer, the plurality of second lower plugs being connected to the second power line and a second terminal of the MOS capacitor,
   the second power line being on one of the first lower plugs that is adjacent to some of the second lower plugs in one of the first and second directions.

2. The device of claim 1, wherein the first and second lower plugs have a vertical length that is greater than a vertical thickness of the electrode structure.

3. The device of claim 1, wherein
   the first power line is over one of the second lower plugs.

4. The device of claim 1, wherein
   the plurality of second lower plugs include a first pair of the second lower plugs adjacent to each other in the first direction and a second pair of the second lower plugs adjacent to each other in the second direction,
   the one of the first lower plugs is between the first pair of the second lower plugs, and
   a second one of the first lower plugs is between the second pair of the second lower plugs.

5. The device of claim 1, further comprising:
   first upper plugs connecting the first lower plugs to the first power line, the first power line being on some of the first upper plugs; and
   second upper plugs connecting the second lower plugs to the second power line, the second power line being on some of the second upper plugs.

6. The device of claim 1, wherein the MOS capacitor comprises:
   a gate electrode on a part of the semiconductor substrate between impurity regions in the semiconductor substrate; and
   a gate dielectric layer between the semiconductor substrate and the gate electrode, wherein
   the first lower plugs are coupled to the gate electrode, and
   the second lower plugs are coupled to the impurity regions.

7. A three-dimensional semiconductor device, comprising:
   a MOS capacitor on a semiconductor substrate, the MOS capacitor including first and second terminals;
   an interlayer dielectric layer covering the MOS capacitor;
   first lower plugs penetrating the interlayer dielectric layer, the first lower plugs coupled to the first terminal of the MOS capacitor;
   second lower plugs penetrating the interlayer dielectric layer, the second lower plugs coupled to the second terminal of the MOS capacitor;
   a first power line and a second power line on the interlayer dielectric layer, the first power line and the second power line being spaced apart from each other in a first direction and extending in a second direction crossing the first direction, the first power line being electrically connected to the first lower plugs, the second power line being electrically connected to the second lower plugs,
   the second power line being on one of the first lower plugs that is adjacent to the second lower plugs in one of the first and second directions.

8. The device of claim 7, wherein one of the second lower plugs is adjacent to the first lower plugs in at least one of the first and second directions.

9. The device of claim 7, further comprising:
   first upper plugs connecting the first lower plugs to the first power line, the first power line being on some of the first upper plugs; and
   second upper plugs connecting the second lower plugs to the second power line, the second power line being on some of the second upper plugs.

10. The device of claim 7, wherein at least one of the first lower plugs is adjacent to some of the second lower plugs in one of the first and second directions.

11. The device of claim 7, wherein the MOS capacitor comprises:
    a gate electrode on a portion of the semiconductor substrate between impurity regions in the semiconductor substrate;
    a gate dielectric layer between the semiconductor substrate and the gate electrode, wherein
    the first lower plugs are coupled to the gate electrode, and
    the second lower plugs are coupled to the impurity regions.

12. The device of claim 11, wherein the gate electrode includes a first part extending in the first direction and a second part extending in the second direction.

13. The device of claim 7, further comprising:
    an electrode structure on the semiconductor substrate; and
    an interlayer dielectric layer covering the electrode structure, wherein
    the semiconductor substrate includes a cell array region and a peripheral circuit region,
    the MOS capacitor is on the peripheral circuit region, and
    the electrode structure includes a plurality of electrodes vertically stacked on the semiconductor substrate.

14. The device of claim 13, wherein the first and second lower plugs have a vertical length greater that is greater than a vertical thickness of the electrode structure.

15. The device of claim 7, wherein
    the first and second lower plugs adjacent to each other in the first direction define a first vertical capacitor,
    the first and second lower plugs adjacent to each other in the second direction define a second vertical capacitor, and
    the first and second vertical capacitors are electrically connected in parallel to each other.

16. A three-dimensional semiconductor device, comprising:
    a substrate including a cell array region and a peripheral circuit region,
    the substrate including an impurity region in the peripheral circuit region;

a gate structure on a portion of the peripheral circuit region next to the impurity region, the gate structure including a gate electrode on a gate insulating layer;
an interlayer dielectric layer covering the gate structure;
a plurality of power lines on the interlayer dielectric layer over the peripheral circuit region, the plurality of power lines including a first power line and a second power line that are spaced apart from each other; and
a plurality of lower plugs on the peripheral circuit region, the plurality of lower plugs extending vertically through the interlayer dielectric layer, the plurality of lower plugs including at least one first lower plug on the gate structure and electrically connected to the first power line,
the plurality of lower plugs including at least one second lower plug electrically connected to the second power line and arranged between the second power line and the peripheral circuit region of the substrate.

17. The device of claim 16, wherein
the first power line and the second power line are spaced apart from each other in a first direction,
the first power line and the second power line extend in a second direction crossing the first direction,
the at least one first lower plug includes a first column including three first lower plugs spaced apart from each other in the second direction on the gate structure below a first gate line and a second column including a first lower plug on the gate structure below the second power line,
the at least one second lower plug includes a first row including a second lower plug on the impurity region below the second power line,
a first vertical capacitor is defined by the second lower plug in the first row being spaced apart in the first direction from one of the three first lower plugs in the first column, and a second vertical capacitor is defined by the second lower plug in the first row being spaced apart in the second direction from the first lower plug in the second column.

18. The device of claim 16, wherein
the first power line and the second power line are spaced apart from each other in a first direction,
the first power line and the second power line extend a second direction crossing the first direction,
the at least one second lower plug includes a first column including three second lower plugs spaced apart from each other in the second direction on the impurity region below a second gate line and a second column including a pair of second lower plugs on the impurity region below the first power line, the at least one first lower plug includes a first row including a first lower plug on the gate structure below the first power line,
a first vertical capacitor is defined by the first lower plug in the first row being spaced apart in the first direction from one of the three second lower plugs in the first column, and a pair of second vertical capacitors are defined by the first lower plug in the first row being arranged between the pair of second lower plugs in the second column.

19. The device of claim 16, wherein
the first power line and the second power line are spaced apart from each other in a first direction,
the first power line and the second power line extend a second direction crossing the first direction,
the at least one first lower plug includes a first row including three first lower plugs spaced apart from each other in the first direction on the gate structure,
the at least one second lower plug includes a first row including three second lower plugs spaced apart from each other in the first direction on the impurity region,
the first row including three first lower plugs is spaced apart in the second direction from the first row including three second lower plugs,
the first power line crosses over one first lower plug and one second lower plug among the first row including three first lower plugs and the first row including three second lower plugs, and
the second power line crosses over a different first lower plug and a different second lower plug among the first row including three first lower plugs and the first row including three second lower plugs.

20. The device of claim 16, further comprising:
a memory cell array on the cell array region, wherein
the interlayer dielectric layer covers the memory cell array,
the first and second power lines are spaced apart from each other in a first direction and extend a second direction crossing the first direction,
the memory cell array includes a plurality of electrodes that are vertically stacked on top of each other in a vertical direction, and a plurality of vertical structures extending in the vertical direction through the plurality of electrodes, and data storage layers between the plurality of electrodes and the plurality of vertical structures, and
the plurality of lower plugs have a vertical length that is greater than a vertical thickness of the plurality of electrodes.

* * * * *